US006919235B1

(12) United States Patent
Yamazaki et al.

(10) Patent No.: US 6,919,235 B1
(45) Date of Patent: Jul. 19, 2005

(54) SEMICONDUCTOR DEVICE HAVING SEMICONDUCTOR CIRCUIT COMPRISING SEMICONDUCTOR ELEMENT, AND METHOD FOR MANUFACTURING SAME

(75) Inventors: Shunpei Yamazaki, Tokyo (JP); Hiroki Adachi, Kanagawa (JP); Hideaki Kuwabara, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/362,192

(22) Filed: Jul. 28, 1999

(30) Foreign Application Priority Data

Aug. 5, 1998 (JP) .......................................... 10-221986

(51) Int. Cl.[7] .......................... H01L 21/00; H01L 21/84
(52) U.S. Cl. ....................... 438/149; 438/151; 438/166; 438/487
(58) Field of Search ................................ 438/149, 151, 438/166, 487, 798

(56) References Cited

U.S. PATENT DOCUMENTS

| | | |
|---|---|---|
| 5,147,826 A | 9/1992 | Liu et al. |
| 5,262,350 A | 11/1993 | Yamazaki et al. |
| 5,275,851 A | 1/1994 | Fonash et al. |
| 5,278,093 A | 1/1994 | Yonehara |
| 5,344,796 A | 9/1994 | Shin et al. |
| 5,352,291 A | 10/1994 | Zhang et al. |
| 5,387,542 A | 2/1995 | Yamamoto et al. |
| 5,403,772 A | 4/1995 | Zhang et al. |
| 5,424,230 A | 6/1995 | Wakai |
| 5,486,237 A | 1/1996 | Sano et al. |
| 5,488,000 A | 1/1996 | Zhang et al. |
| 5,501,989 A | 3/1996 | Takayama et al. |

(Continued)

FOREIGN PATENT DOCUMENTS

| | | |
|---|---|---|
| JP | 04-035021 | 2/1992 |
| JP | 04-286336 | 10/1992 |
| JP | 7-162004 | 6/1995 |
| WO | WO 93/10555 | 5/1993 |

OTHER PUBLICATIONS

Bonnel et al., "Polycrystalline Silicon Thin–Film Transistors with Two–Step Annealing Process", pp. 551–553, Dec. 1993, IEEE Electron Device Letters, vol. 14, No. 12.

Fuse et al., "Performance of Poly–Si Thin Film Transistors Fabricated by Excimer–Laser Annealing of SiH4– and SiH2H6– Source Low Pressure Vapor Deposited a–Si Films With or Without Solid–Phase Crystallization", pp. 565–570, 1994, Solid State Phenomena vols. 37–38.

Specifications for U.S. Appl. No. 09/259,211, "Method of Manufacturing a Semiconductor Device and Manufacturing System Thereof".

(Continued)

Primary Examiner—Alexander Ghyka
(74) Attorney, Agent, or Firm—Eric J. Robinson; Robinson Intellectual Property Law Office, P.C.

(57) ABSTRACT

The invention is to provide a semiconductor device having a semiconductor circuit comprising a semiconductor element having improved TFT characteristics and uniform characteristics by improving an active layer, particularly an interface between a region forming a channel forming region and a gate insulating film. In the invention in order to attain the object described above, an material for promoting crystallization is added to a substrate or an underlayer film, an initial semiconductor film and a first gate insulating film are continuously formed, crystallization of the initial semiconductor film is conducted by irradiation of an infrared ray or an ultraviolet ray (laser light) through the first gate insulating film, patterning is conducted to obtain an active layer and the first gate insulating film, which have desired shapes, and a second gate insulating film is formed.

17 Claims, 13 Drawing Sheets

U.S. PATENT DOCUMENTS

| | | | |
|---|---|---|---|
| 5,529,937 A | 6/1996 | Zhang et al. | |
| 5,531,182 A | 7/1996 | Yonehara | |
| 5,550,070 A | 8/1996 | Funai et al. | |
| 5,578,520 A | 11/1996 | Zhang et al. | |
| 5,582,880 A | 12/1996 | Mochizuki et al. | |
| 5,605,846 A | 2/1997 | Ohtani et al. | |
| 5,612,250 A | 3/1997 | Ohtani et al. | |
| 5,621,224 A | 4/1997 | Yamazaki et al. | |
| 5,624,873 A * | 4/1997 | Fonash et al. | 438/487 |
| 5,637,512 A * | 6/1997 | Miyasaka et al. | 438/166 |
| 5,643,826 A | 7/1997 | Ohtani et al. | |
| 5,654,203 A | 8/1997 | Ohtani et al. | |
| 5,712,191 A | 1/1998 | Nakajima et al. | |
| 5,744,824 A | 4/1998 | Kousai et al. | |
| 5,756,364 A | 5/1998 | Tanaka et al. | |
| 5,766,360 A | 6/1998 | Sato et al. | |
| 5,773,327 A | 6/1998 | Yamazaki et al. | |
| 5,783,468 A | 7/1998 | Zhang et al. | |
| 5,795,795 A | 8/1998 | Kousai et al. | |
| 5,811,323 A * | 9/1998 | Miyasaka et al. | 438/155 |
| 5,811,327 A | 9/1998 | Funai et al. | |
| 5,821,138 A | 10/1998 | Yamazaki et al. | |
| 5,824,573 A | 10/1998 | Zhang et al. | |
| 5,824,574 A | 10/1998 | Yamazaki et al. | |
| 5,830,784 A | 11/1998 | Zhang et al. | |
| 5,840,118 A | 11/1998 | Yamazaki | |
| 5,843,225 A | 12/1998 | Takayama et al. | |
| 5,851,860 A * | 12/1998 | Makita et al. | 438/166 |
| 5,851,862 A | 12/1998 | Ohtani et al. | |
| 5,854,096 A | 12/1998 | Ohtani et al. | |
| 5,858,819 A * | 1/1999 | Miyasaka | 438/149 |
| 5,858,823 A | 1/1999 | Yamazaki et al. | |
| 5,861,337 A | 1/1999 | Zhang et al. | |
| 5,869,362 A | 2/1999 | Ohtani | |
| 5,873,942 A | 2/1999 | Park et al. | |
| 5,879,977 A | 3/1999 | Zhang et al. | |
| 5,882,165 A | 3/1999 | Maydan et al. | |
| 5,882,960 A | 3/1999 | Zhang et al. | |
| 5,897,347 A | 4/1999 | Yamazaki et al. | |
| 5,900,105 A | 5/1999 | Toshima | |
| 5,904,770 A | 5/1999 | Ohtani et al. | |
| 5,923,962 A | 7/1999 | Ohtani et al. | |
| 5,923,968 A | 7/1999 | Yamazaki et al. | |
| 5,923,997 A | 7/1999 | Mitanaga et al. | |
| 5,937,282 A | 8/1999 | Nakajima et al. | |
| 5,953,597 A | 9/1999 | Kusumoto et al. | |
| 5,956,581 A | 9/1999 | Yamazaki et al. | |
| 5,966,594 A | 10/1999 | Adachi et al. | |
| 5,976,259 A | 11/1999 | Yamazaki | |
| 5,985,704 A | 11/1999 | Adachi et al. | |
| 5,985,741 A | 11/1999 | Yamazaki et al. | |
| 5,986,286 A | 11/1999 | Yamazaki et al. | |
| 5,994,172 A | 11/1999 | Ohtani et al. | |
| 6,008,101 A | 12/1999 | Tanaka et al. | |
| 6,048,758 A | 4/2000 | Yamazaki et al. | |
| 6,066,516 A * | 5/2000 | Miyasaka | 438/149 |
| 6,077,759 A | 6/2000 | Yamazaki et al. | |
| 6,140,165 A | 10/2000 | Zhang et al. | |
| 6,140,667 A | 10/2000 | Yamazaki et al. | |
| 6,156,627 A | 12/2000 | Zhang et al. | |
| 6,160,827 A | 12/2000 | Tanaka | |
| 6,165,876 A | 12/2000 | Yamazaki et al. | |
| 6,197,624 B1 | 3/2001 | Yamazaki | |
| 6,285,042 B1 | 9/2001 | Ohtani et al. | |
| 6,294,441 B1 | 9/2001 | Yamazaki | |
| 6,319,761 B1 | 11/2001 | Zhang et al. | |
| 6,337,229 B1 | 1/2002 | Yamazaki et al. | |
| 2002/0155706 A1 | 10/2002 | Mitsuki et al. | |

OTHER PUBLICATIONS

"Recent Progress of Low Temperature poly–Si Technology" Hiroshi TSUTSU, Proceedings of Electronic Display Forum, 99, pp. 4–31 to 4–38 (Full translation attached).

"Uniformity Improvement of Excimer Laser Crystallized Poly–Si Thin Film Transistors" Sera et al., AM–LCD '96/ IDW '96, 1996, pp. 85–88.

\* cited by examiner

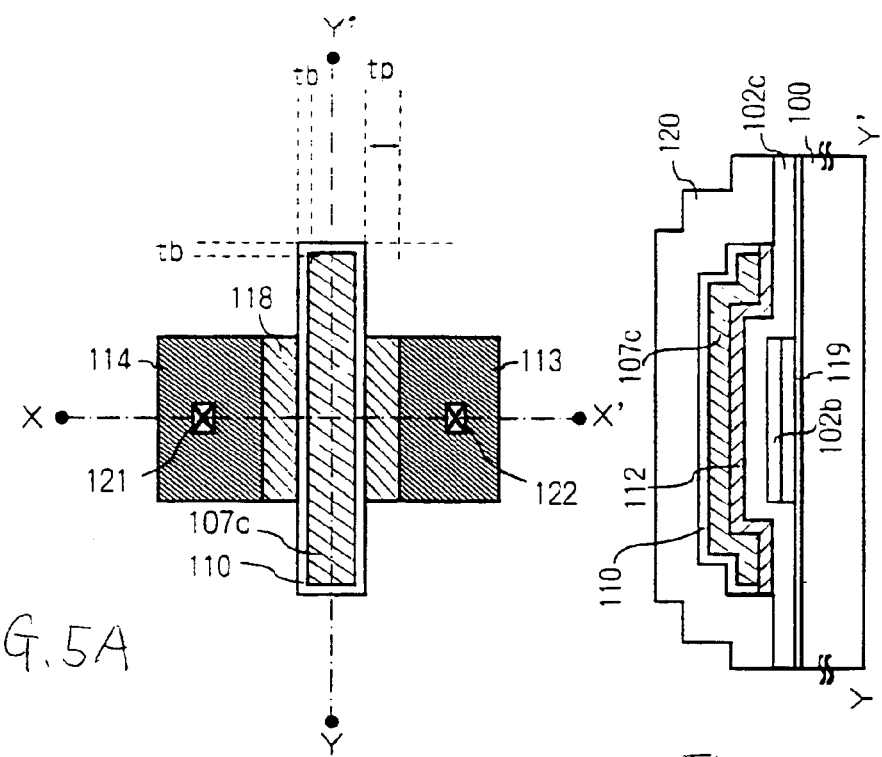
FIG.5A
FIG.5C  Y-Y' SECTION
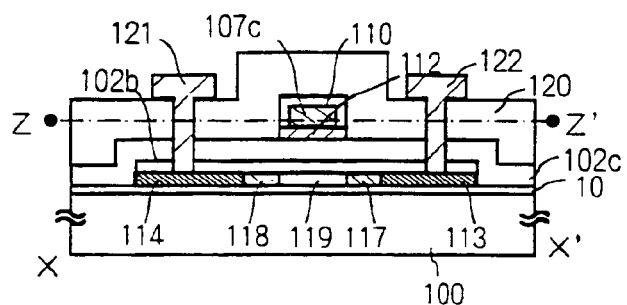
FIG.5B    X-X' SECTION

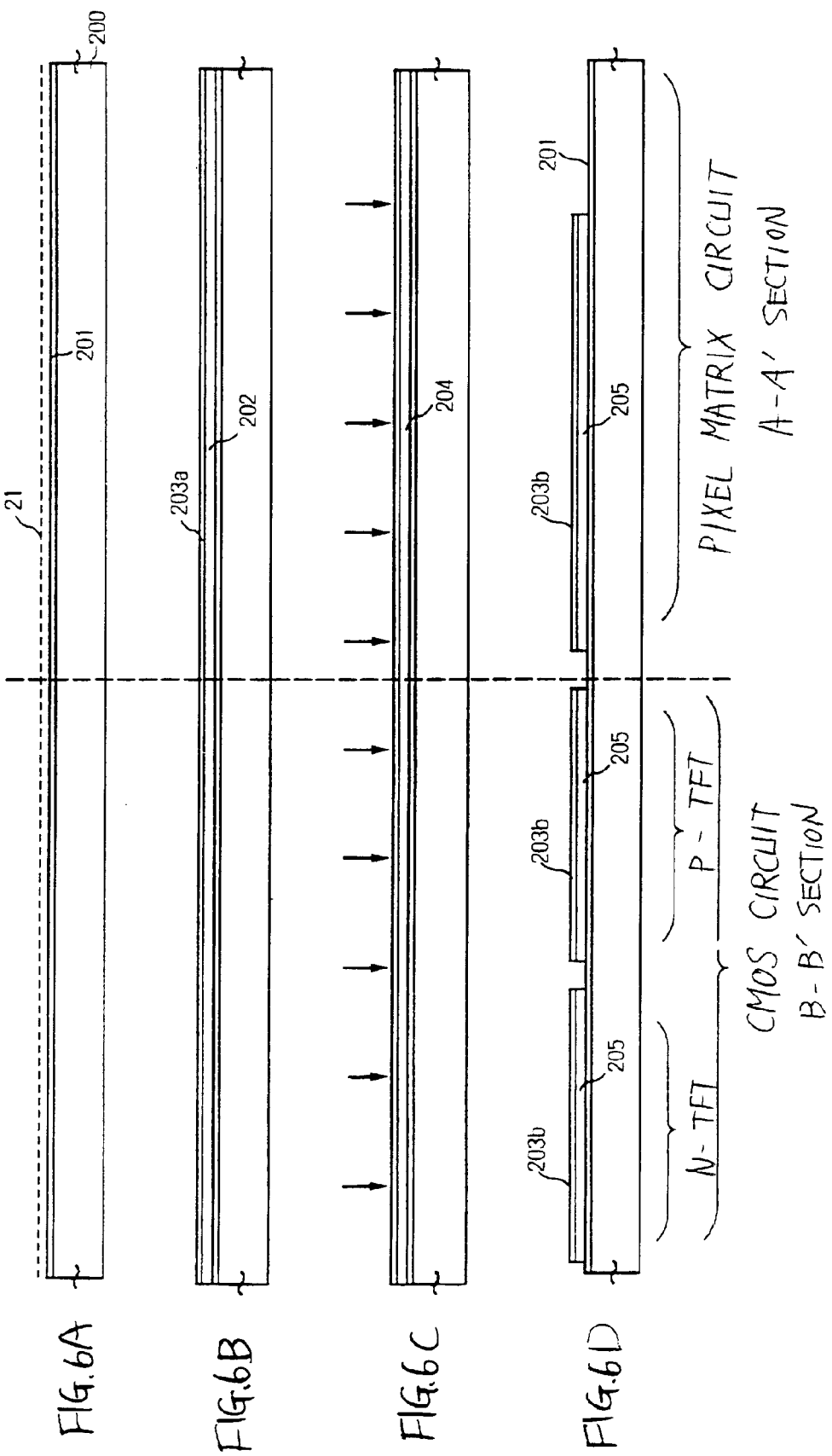

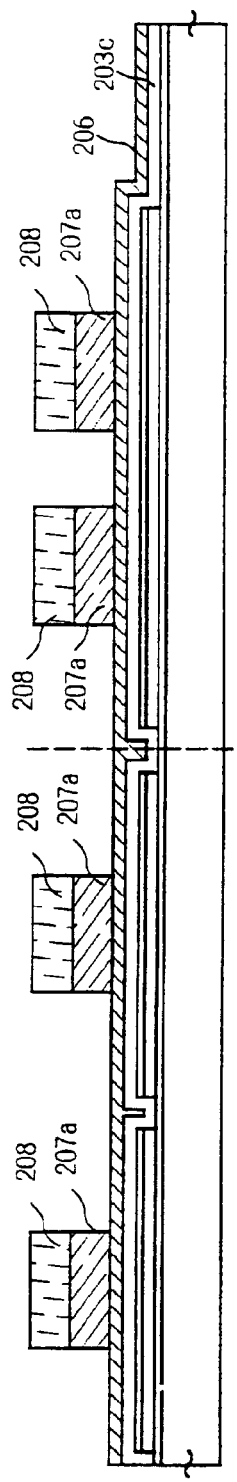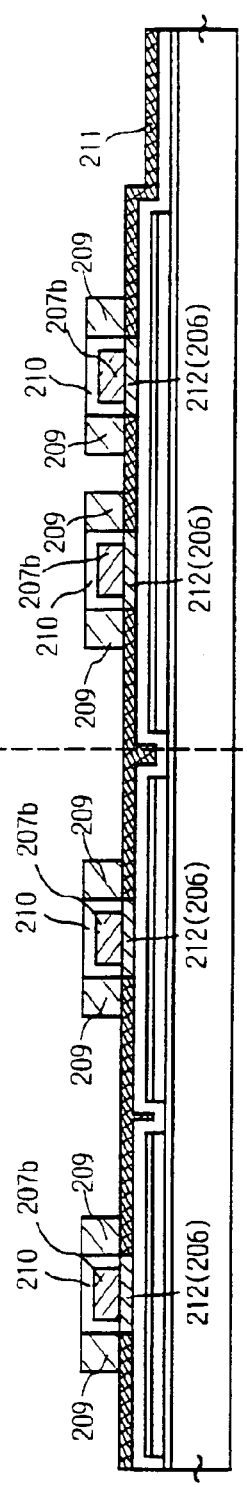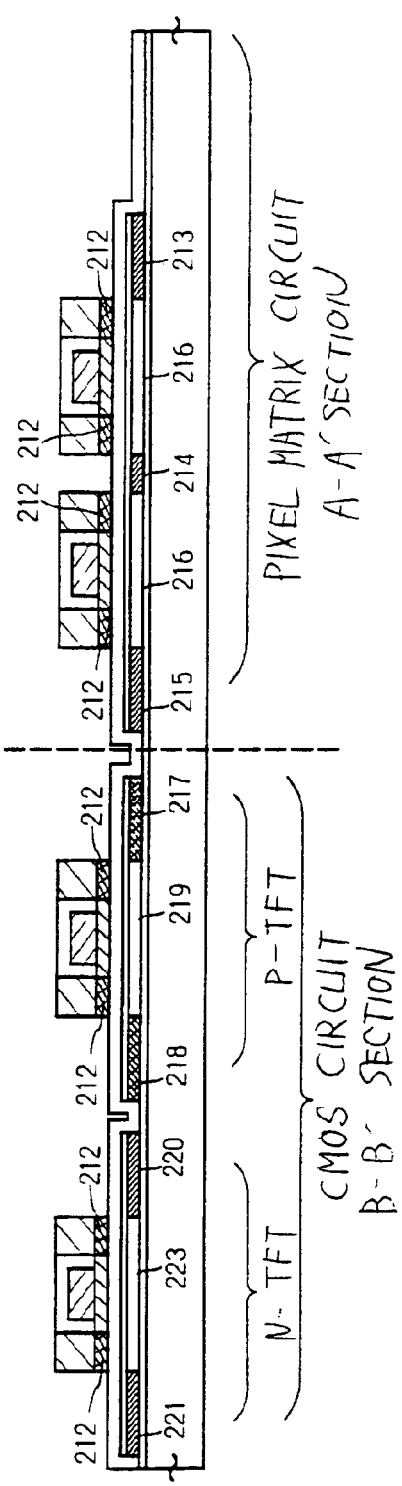
FIG. 7A
FIG. 7B
FIG. 7C

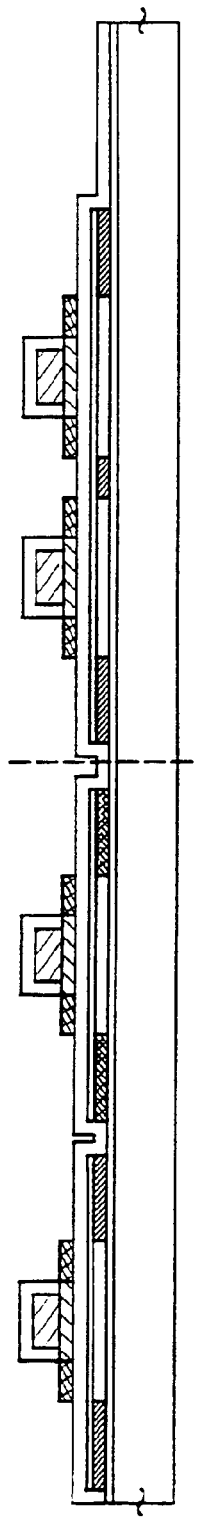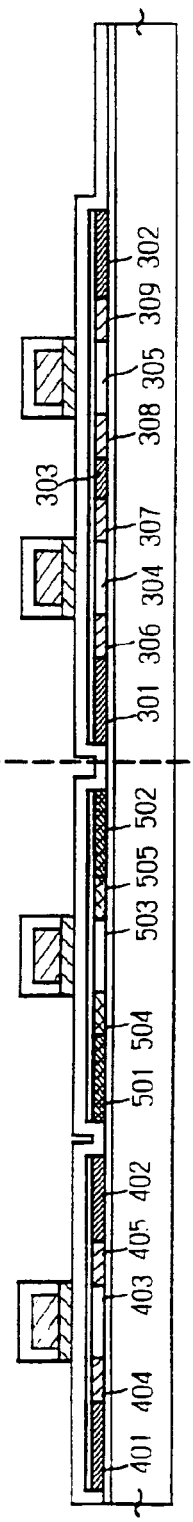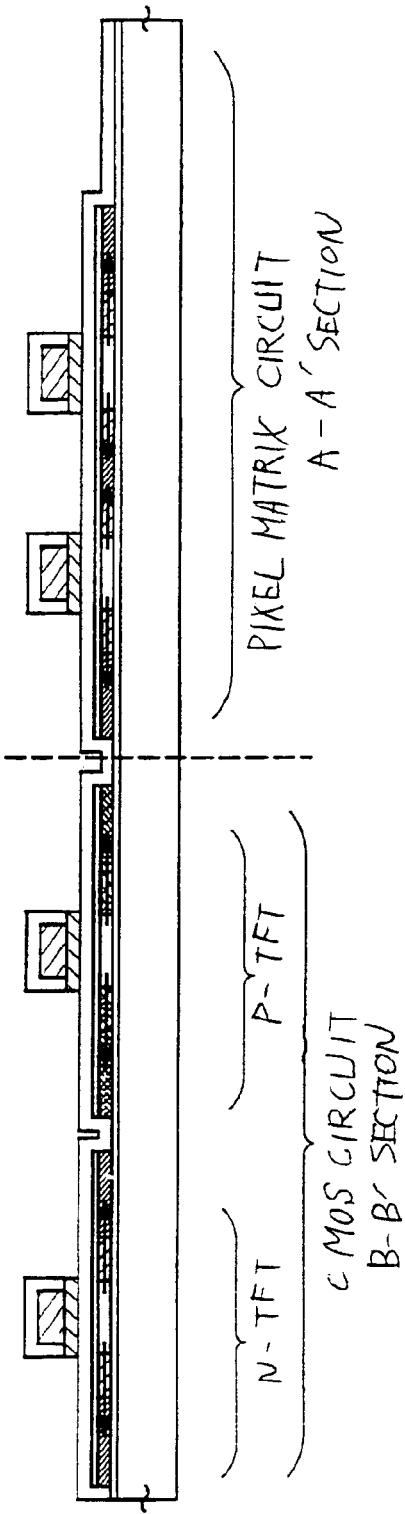

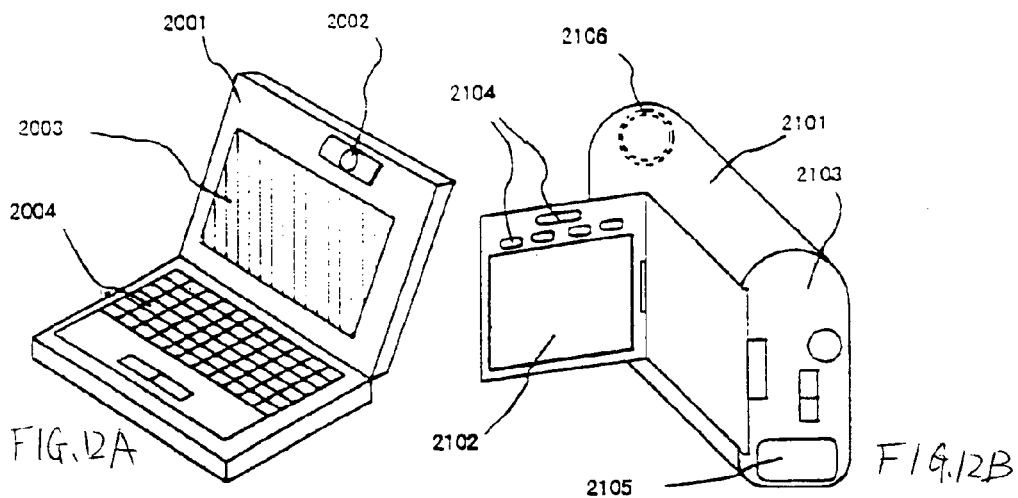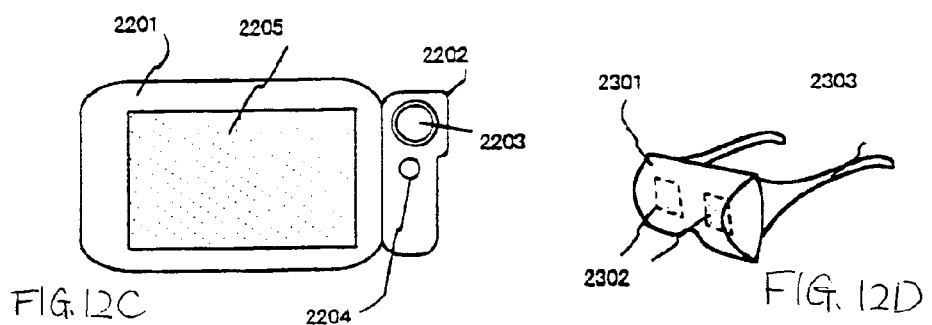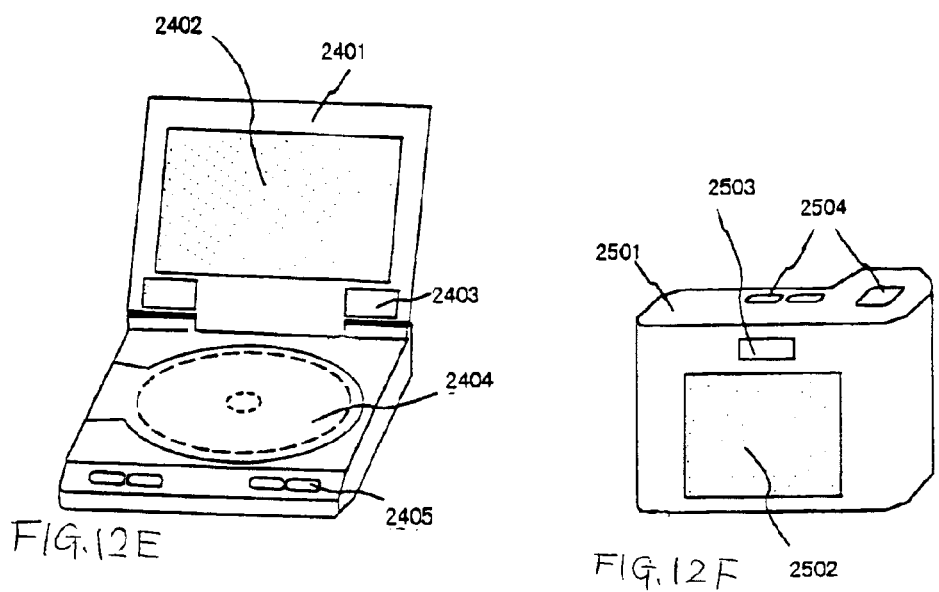

SCREEN

SEMICONDUCTOR DEVICE HAVING SEMICONDUCTOR CIRCUIT COMPRISING SEMICONDUCTOR ELEMENT, AND METHOD FOR MANUFACTURING SAME

FIELD OF THE INVENTION

The present invention relates to a structure of a semiconductor device having a semiconductor circuit comprising a semiconductor element, such as an insulating gate type transistor, and a method for manufacturing the same. In particular, it relates to a semiconductor device having a semiconductor circuit comprising a semiconductor element having a wiring formed with a valve metallic film, and a method for manufacturing the same. The semiconductor device of the invention includes not only an element, such as a thin film transistor (TFT) and a MOS transistor, but also an electro-optical device, such as a display device and an image sensor, having a semiconductor circuit comprising the insulating gate type transistor. Furthermore, the semiconductor device of the invention includes an electronic equipment comprising the display device and the electro-optical device.

BACKGROUND OF THE INVENTION

An active matrix type liquid crystal display having a pixel matrix circuit and a driver circuit comprising a thin film transistor (TFT) formed on a substrate having an insulating property is receiving attention. The liquid crystal display is utilized as a display device of a size of from 0.5 to 20 inches.

At the present time, in order to realize a liquid crystal display capable of conducting highly minute display, a TFT having a crystalline semiconductor film, such as polysilicon, as an active layer is receiving attention. The TFT having a crystalline semiconductor film as an active layer has a higher operation rate and a higher driving capability than a TFT having an amorphous semiconductor layer as an active layer, but involves a problem in that unevenness in electric characteristics of the respective TFT is large.

One of the policy of development of a liquid crystal display is to develop one having a large area. When a liquid crystal display has a large area, the pixel matrix circuit to be a pixel display part also has a large area, and thus a source wiring and a gate wiring arranged in a matrix form become long to increase a wiring resistance. Furthermore, in order to cope with the demand of high minuteness, the wiring must be thin to make the increase in wiring resistance conspicuous. The source wiring and the gate wiring are connected to a TFT for the respective pixels, and increase in number of pixels brings about a problem of increase in parasitic capacity. In the liquid crystal display, the gate wiring and the gate electrode are generally formed as unified, and the delay of the gate signal becomes conspicuous with the display panel having a large area.

Accordingly, the lower the resistivity of the material of the gate electrode wiring is, the thinner and longer the gate wiring can be, and thus a display panel of a large area can be produced. While Al, Ta and Ti have been used as the material of the gate electrode wiring, Al has been frequently used since Al has the lowest resistivity among them and is a metal capable of being subjected to anodic oxidation. The heat resistance of Al can be increased by forming an anodic oxidation film. However, even at a process temperature of from 300 to 400° C., whiskers and hillocks are formed, and the wiring suffers deformation and diffusion into an insulating film and an active layer, which become causes of operation failure of the TFT and deterioration of the TFT characteristics.

Furthermore, in order to conduct anodic oxidation, an electrode and a wiring to be subjected to anodic oxidation must be connected to a voltage supplying line, and after completing the anodic oxidation treatment, the voltage supplying line and the unnecessary connection part to the voltage supplying line must be removed by etching. Therefore, in order to produce a thin film transistor by using the anodic oxidation treatment, a space for forming the voltage supplying line and an etching margin are necessary, which prevent integration of the circuit.

In recent years, a high mobility is demanded for a TFT, and it is the major trend that a crystalline semiconductor film having a higher mobility than an amorphous semiconductor film is used as an active layer of the TFT. A conventional TFT is produced in the manner, which will be described below.

An amorphous silicon film is formed on an insulating substrate, and the amorphous silicon film is subjected to a crystallization treatment by heating or irradiation with laser light, to form a polysilicon film (polycrystalline silicon film). After patterning the polysilicon film in a desired shape, a gate insulating film and a layer of a material for forming a gate electrode are accumulated thereon, and a gate electrode is formed by patterning them. An impurity giving a conductivity is then selectively introduced into the polysilicon film to form an impurity region to be a source region and a drain region. After an interlayer insulating film is then accumulated, and a contact hole is formed to expose the source region and the drain region, a metallic film is formed and patterned to form a metallic wiring in contact with the source region and the drain region. Thus, the production process of the TFT is finished.

In the conventional method described above, after the semiconductor film having an amorphous substance is formed, the gate insulating film is formed after conducting some steps (such as the crystallization step and the patterning step).

Therefore, before forming the gate insulating film, the surface of the crystalline semiconductor film to be an active layer is contaminated or oxidized by an impurity in the air (oxygen and water) or an impurity formed in the steps before the formation of the gate insulating film. When the gate insulating film is formed on the crystalline semiconductor film having the contaminated or oxidized surface, the active layer, particularly the interface characteristics between a channel forming region and the gate insulating film, is deteriorated, to become a cause of unevenness and lowering of the electric characteristics of the TFT.

SUMMARY OF THE INVENTION

An object of the invention is to provide a semiconductor device and a method for manufacturing the same, which has a semiconductor circuit comprising a semiconductor element having improved TFT characteristics and uniform characteristics by such a manner that an active layer, particularly an interface between a region forming a channel forming region and a gate insulating film, is improved.

Another object of the invention is to conduct anodic oxidation of a gate wiring without forming a voltage supplying line for anodic oxidation.

Further object of the invention is to produce a semiconductor element with a good yield by preventing diffusion of an aluminum atom and deformation of the wiring due to heating.

In the invention to attain the objects, an underlayer film is formed on an insulating surface; a catalytic element is added to a surface of the underlayer film; an initial semiconductor film and a first gate insulating film are continuously formed; crystallization is conducted by irradiation of an infrared ray or an ultraviolet ray (laser light) through the first gate insulating film; patterning is conducted to obtain an active layer and a gate insulating layer, which have desired shapes; and a second gate insulating film is formed. It is preferred that the irradiation with laser light is also continuously conducted without exposing to the air.

The term continuous forming used herein means that the films are formed continuously with maintaining high vacuum without exposing to the air. For example, it means that the formation of the films is continuously conducted by transporting among chambers without exposing to the air, or the formation of the films is continuously conducted in one chamber without exposing to the air by changing reaction gases.

In the invention, also, a gate electrode is made to have a multi-layer structure; a wiring layer of an upper layer is formed with a material having a low resistance, preferably aluminum or a material mainly comprising aluminum; and a wiring layer of a lower layer is formed with a valve metal having a melting point higher than the material of the wiring layer of the upper layer, preferably tantalum or a material mainly comprising tantalum (such as TaN) that can be subjected to anodic oxidation in the same electrolytic solution as the material mainly comprising aluminum.

The invention relates to, as a first aspect, a semiconductor device having a semiconductor circuit comprising a semiconductor element, the semiconductor element comprising an active layer comprising a crystalline semiconductor film formed on a surface having an insulating property, a first insulating film formed in contact with an upper surface of the active layer, a second insulating film formed in contact with a side surface of the active layer and in contact with an upper surface and a side surface of the first insulating film, and a gate wiring having a multi-layer structure formed in contact with an upper surface of the second insulating layer.

The invention also relates to, as a second aspect, a semiconductor device having a semiconductor circuit comprising a semiconductor element, the semiconductor element comprising an active layer comprising a crystalline semiconductor film formed on a surface having an insulating property, a first insulating film formed in contact with an upper surface of the active layer, a second insulating film formed in contact with a side surface of the active layer and in contact with an upper surface and a side surface of the first insulating film, and a gate wiring having a multi-layer structure formed in contact with an upper surface of the second insulating layer, wherein the second insulating film has a film thickness thicker than the first insulating film.

In the aspects described above, it is preferred that the crystalline semiconductor film is formed by a method comprising a step of adding a catalytic element promoting crystallization to an initial semiconductor film, and a step of crystallizing the initial semiconductor film without melting, by irradiating an infrared ray or an ultraviolet ray through the first insulating film.

It is preferred that the catalytic element is at least one selected from the group consisting of Ni, Fe, Co, Pt, Cu, Au and Ge.

It is also preferred that the initial semiconductor film comprises a semiconductor film having an amorphous substance or a semiconductor film having a microcrystalline substance.

In the aspects described above, it is preferred that a concentration of an impurity at an interface between the first insulating film and the active layer is lower than a concentration of an impurity at an interface between the first insulating film and the second insulating film.

In the aspects described above, it is preferred that the gate wiring having a multi-layer structure comprises at least one layer mainly comprising an element selected from the group consisting of aluminum, tantalum, molybdenum, titanium, chromium and silicon.

In the aspects described above, it is preferred that the gate wiring has a multi-layer structure comprising a first conductive film having laminated thereon a second conductive film, the first conductive film comprises tantalum or a material mainly comprising tantalum, and the second conductive film comprises aluminum or a material mainly comprising aluminum.

In the aspects described above, it is preferred that the first insulating film has a film thickness of from 1 to 50 nm, and it is preferred that the second insulating film has a film thickness of from 100 to 200 nm.

In the aspects described above, it is preferred that the active layer comprises a source region, a drain region and a channel forming region formed between the source region and the drain region.

In the aspects described above, it is preferred that at least a part of the source region and the drain region comprises a silicide.

In the aspects described above, it is preferred that an impurity giving an N-type conductivity is added to the source region and the drain region.

In the aspects described above, it is preferred that an impurity giving an N-type conductivity and an impurity giving a P-type conductivity are added to the source region and the drain region.

In the aspects described above, it is preferred that the channel forming region contains a catalytic element promoting crystallization, and a concentration of the catalytic element in the source region and the drain region is higher than the channel forming region.

The invention relates to, as a third aspect, a method for manufacturing a semiconductor device having a semiconductor circuit comprising a semiconductor element, the method comprising a step of contacting a catalytic element promoting crystallization to at least a part of an underlayer film having an insulating surface, a step of continuously forming an initial semiconductor film and a first insulating film on the underlayer film, a step of crystallizing the initial semiconductor film by irradiating an infrared ray or an ultraviolet ray through the first insulating film, to obtain a crystalline semiconductor film, a step of patterning the crystalline semiconductor film and the first insulating film to match an end surface of the initial semiconductor film and an end surface of the first insulating film, a step of forming a second insulating film to cover the crystalline semiconductor film and the first insulating film, and a step of forming a gate wiring having a multi-layer structure on the insulating film.

The invention relates to, as a fourth aspect, a method for manufacturing a semiconductor device having a semiconductor circuit comprising a semiconductor element, the method comprising a step of contacting a catalytic element promoting crystallization to at least a part of an underlayer film having an insulating surface, a step of continuously forming an initial semiconductor film and a first insulating film on the underlayer film, a step of crystallizing the initial semiconductor film by irradiating an infrared ray or an ultraviolet ray through the first insulating film, to obtain a crystalline semiconductor film, a step of patterning the crystalline semiconductor film and the first insulating film to match an end surface of the initial semiconductor film and an end surface of the first insulating film, a step of forming a second insulating film to cover the crystalline semiconductor film and the first insulating film, a step of forming a gate wiring having a multi-layer structure on the insulating film, a step of conducting doping of a phosphorous element to a region to be a source region and a drain region, and a step of gettering the catalytic element by conducting a heat treatment.

In the aspects of the method described above, it is preferred that the step of forming the gate wiring having a multi-layer structure comprises a step of forming a first metallic film on an insulating film, a step of forming a second metallic film in contact with the first metallic film, a step of patterning the second metallic film to form a second wiring layer comprising the second metallic film on the first metallic film, a step of applying a voltage to the first metallic film to conduct anodic oxidation of the second wiring layer and anodic oxidation of the first metallic film, and a step of selectively removing an anodic oxidation film of the first metallic film to form a first wiring layer.

In the aspects of the method described above, it is preferred that the method further comprises a step of adding an impurity ion giving a conductive type to the crystalline semiconductor film through the first insulating film and the second insulating film.

In the aspects of the method described above, it is preferred that the step of obtaining the crystalline semiconductor film comprises a step of crystallizing the initial semiconductor film without melting the initial semiconductor film.

BRIEF DESCRIPTION OF THE DRAWINGS

FIGS. 5A to 5C are a plan view and cross sectional views showing an example of the production method according to the invention.

FIGS. 6A to 6D are cross sectional views showing an example of the production method according to the invention.

FIGS. 7A to 7C are cross sectional views showing an example of the production method according to the invention.

FIGS. 8A to 8C are cross sectional views showing an example of the production method according to the invention.

FIGS. 12A to 12F are perspective views of examples of an electric device.

DESCRIPTION OF PREFERRED EMBODIMENTS

The semiconductor device according to the invention and the method for manufacturing the same will be briefly described with reference to FIGS. 1A to 1E, 2A to 2E, 3A to 3E, 4A to 4C, and 5A to 5C.

A substrate 100 having an insulating surface is prepared. Examples of the substrate 100 include an insulating substrate, such as a glass substrate, a quartz substrate, crystalline glass and a plastic substrate, a semiconductor substrate (such as a silicon substrate) having an underlayer film, and a metallic substrate (such as a stainless steel substrate) having an underlayer film.

An underlayer film 10 is then formed on the substrate 100 having an insulating surface. Examples of the underlayer film 10 include a silicon oxide film, a silicon nitride film, a silicon oxynitride film (SiOxNy) and a laminated film thereof. The underlayer film can be formed by known methods, such as a reduced pressure CVD method, a thermal CVD method, a plasma CVD method and a sputtering method.

A catalytic element promoting crystallization of a semiconductor material is added to the whole surface of the substrate or the underlayer film, or selectively added to them. The catalytic element can be added by a sputtering method, a CVD method, a plasma treatment method, an adsorption method, an ion implantation method or a method of coating a solution containing the catalytic element. (FIG. 1A) As the catalytic element promoting crystallization, one kind or plural kinds of elements selected from the group consisting of Fe, Co, Ni, Ru, Rh, Pd, Os, Ir, Pt, Cu and Au can be used. A catalytic element of a lattice substitution type (or a melting type), such as Ge and Pb, can also be used. By employing this technique, a crystalline semiconductor film can be produced by a low temperature process. An example using nickel (Ni) as the catalytic element will be specifically described herein.

Figure 1A:
FIGS. 1A to 1E are cross sectional views showing an embodiment of the production method according to the invention.
Figure 1B:
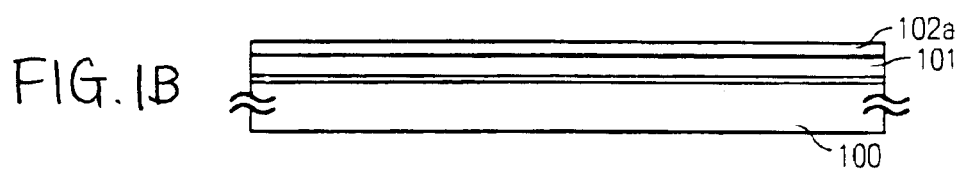
Figure 1C:
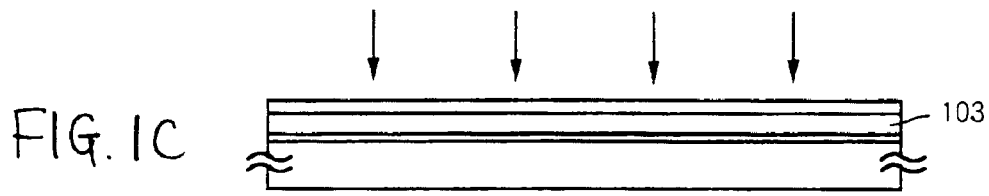

An initial semiconductor film 101 and a first gate insulating film 102a are then continuously formed. (FIG. 1B)

The term initial semiconductor film used herein is a general term of a semiconductor film, representative examples of which include a semiconductor film having an amorphous substance, such as an amorphous semiconductor film (e.g., amorphous silicon), an amorphous semiconductor film having a microcrystalline substance, and a microcrystalline semiconductor film. These semiconductor films are films comprising an Si film, a Ge film, and a compound semiconductor film (such as, an amorphous silicon germanium film represented by SixGe1−x (0<x<1)). The initial semiconductor film can be formed by known methods, such as a reduced pressure CVD method, a thermal CVD method and a plasma CVD method.

Examples of the first gate insulating film 102a include a silicon oxide film, a silicon nitride film, a silicon oxynitride film (SiOxNy) and a laminated film thereof, in the thickness range of from 1 to 50 nm. The first gate insulating film 102a can be formed by known methods, such as a reduced pressure CVD method, a thermal CVD method, a plasma CVD method and a sputtering method. Furthermore, an oxide film obtained by subjecting the initial semiconductor film 101 to plasma oxidation or thermal oxidation, and a nitride film obtained by subjecting the same to plasma nitriding can also be used as the first gate insulating film.

In the invention, excellent interface characteristics can be obtained by continuously forming the first gate insulating film without exposing to the air after the formation of the initial semiconductor film. It is preferred that the temperatures on the formation of the films are made identical to relax the stress between the layers. Furthermore, in order to decrease the hydrogen concentration in the film of the initial semiconductor film, it is preferred to conduct a film forming step at a film forming temperature of from 400 to 500° C., or to conduct a heat treatment at a temperature of from 350 to 500° C. after conducting the continuous film formation.

The amorphous semiconductor film 101 is irradiated with an infrared ray or an ultraviolet ray through the first gate insulating film 102a to conduct crystallization (hereinafter referred to as laser crystallization) of the same to form a crystalline semiconductor film 103. (FIG. 1C) It is preferred that the laser crystallization is continuously conducted without exposing to the air.

The term crystalline semiconductor film is a general term of a semiconductor film having regularity in the structure thereof, and includes a single crystal semiconductor film, a polycrystalline semiconductor film (such as, a polycrystalline silicon film), a microcrystalline semiconductor film, and a semiconductor film having a structure partly having regularity.

In the case where an ultraviolet ray is used as the crystallization technique, high-intensity light emitted from an excimer laser or an ultraviolet laser may be used, and in the case where an infrared ray is used, high-intensity light emitted from an infrared laser or an infrared lamp may be used. In this embodiment, crystal growth proceeds with progress of diffusion of the catalytic element (Ni) from the interface between the underlayer film and the semiconductor film having an amorphous substance. There are a case where the semiconductor film having an amorphous substance is crystallized through a molten state, and a case where the semiconductor film having an amorphous substance is crystallized without melting through a solid state or an intermediate state s between a solid state and a liquid state, depending on the conditions of the laser crystallization. The conditions of the laser crystallization (such as a wavelength of the laser light, an irradiation intensity, a pulse width, a repeating frequency and an irradiation time) are appropriately determined with considering the film thickness of the first gate insulating film, the film thickness of the semiconductor film having an amorphous substance, and the temperature of the substrate. After completing the laser crystallization, a hydrogenation treatment by a known method may be conducted.

Figure 1D:
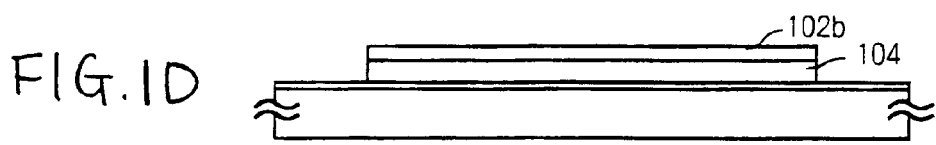
Figure 1E:
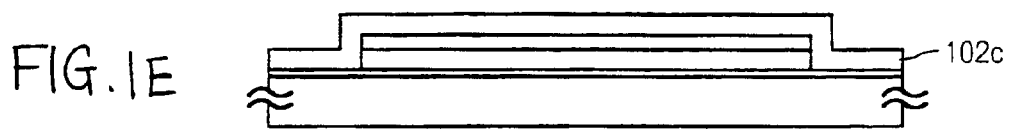

The first gate insulating film and the crystalline semiconductor film are patterned into the desired forms to obtain an active layer 104 comprising a first gate insulating layer 102b and the crystalline semiconductor film. (FIG. 1D)

A second gate insulating film 102c are formed to cover the whole surface of the substrate. (FIG. 1E) Examples of the second gate insulating film include a silicon oxide film, a silicon nitride film, a silicon oxynitride film (SiOxNy) and a laminated film thereof, in the thickness range of from 100 to 200 nm.

A laminated film of a first conductive film 105 and a second conductive film 106 is then formed. (FIG. 2A) Examples of the material of the first conductive film 105 include a material mainly comprising a valve metal, such as a material mainly comprising tantalum (Ta), niobium (Nb), hafnium (Hf), zirconium (Zr), titanium (Ti) and chromium (Cr), in the thickness range of from 1 to 50 nm, preferably from 5 to 30 nm, and more preferably from 5 to 20 nm. In this embodiment, an example using tantalum (Ta) as the first conductive film is specifically described. Because tantalum has a working function close to that of silicon, tantalum is one of preferred materials that exhibit a small shift in threshold value of the TFT. Furthermore, because tantalum can be subjected to anodic oxidation in the same electrolytic solution as the material mainly comprising aluminum, tantalum is preferred in the invention.

The term valve metal used herein means a metal exhibiting a valve function in that a barrier type anodic oxidation film anodically formed is allowed to pass a cathode electric current but is not allowed to pass an anode electric current. (Denkikagaku Binran (Handbook of Electrochemistry) 4th Ed., edited by Society of Electrochemistry, p. 370, Maruzen (1985)).

Examples of the material of the second conductive film 106 include a conductive material having a low resistance for forming a second wiring layer to mainly become a path of an electric charge, such as aluminum and a material mainly comprising aluminum, in a thickness range of from 200 to 500 nm. In this embodiment, an example using an aluminum film as the second conductive film is specifically described.

A resist mask 108 is then formed, and the second conductive film 106 is patterned to form a second wiring layer 107a comprising the second conductive film. (FIG. 2B) The second wiring layer 107a constitutes an upper layer of the gate wiring.

First anodic oxidation is conducted by contacting a probe of an anodic oxidation device to the first conductive film 105 with the resist mask 108 remaining. (FIG. 2C) In the first anodic oxidation, an anodic oxide of a porous type (porous alumina) 109 is formed on the side surface of the second wiring layer.

After removing the resist mask 108, the probe of the anodic oxidation device is made in contact with the first conductive film to conduct second anodic oxidation. (FIG. 2D) In the second anodic oxidation, an anodic oxide of a barrier type (non-porous alumina) is formed on the surface of the second wiring layer 107c. In the first conductive film, an exposed region and a region, at which the anodic oxide of a porous type 109 is present, are subjected to anodic oxidation, to form tantalum oxide (TaOx) 111. The first conductive film 112 that has not been subjected to anodic oxidation constitutes a wiring layer.

Figure 2A:
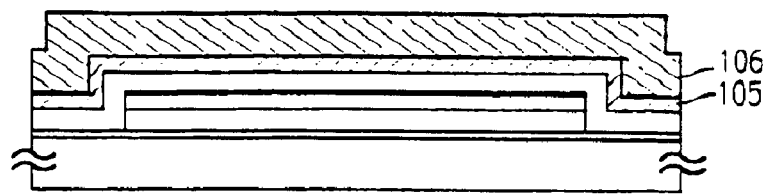
FIGS. 2A to 2E are cross sectional views showing an embodiment of the production method according to the invention.
Figure 2B:
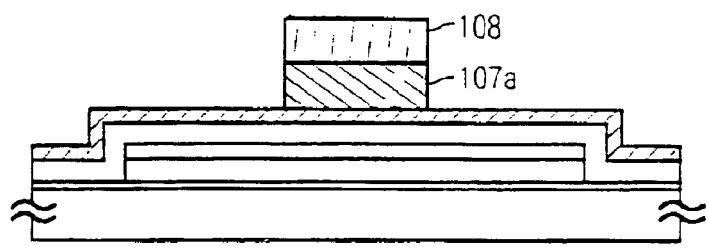
Figure 2C:
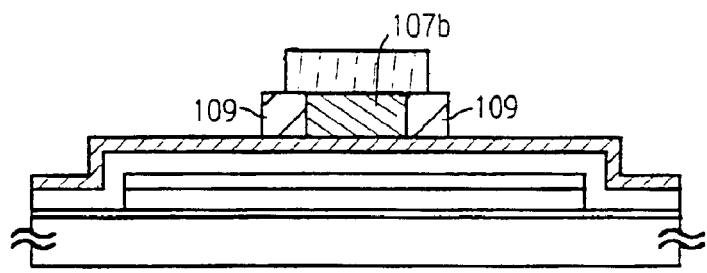
Figure 2D:
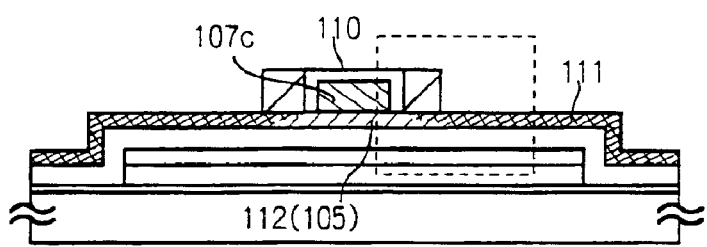
Figure 2E:
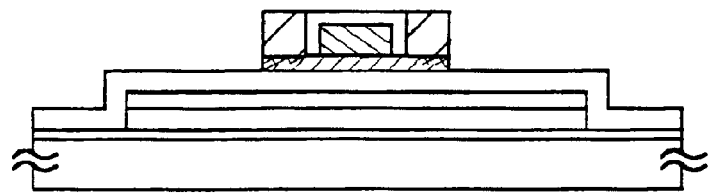
Figure 4A:
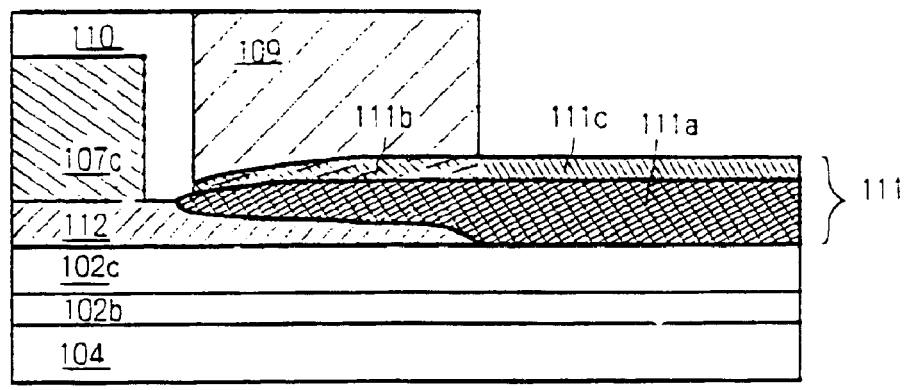
FIGS. 4A to 4C are enlarged cross sectional views showing an embodiment of the production method according to the invention.

FIG. 4A is an enlarged cross sectional view of the area surrounded with dotted lines in FIG. 2D. On the region where the first conductive film is exposed and subjected to anodic oxidation, tantalum oxide layers 111a and 111c are laminated. On the region in contact with the anodic oxide of a porous type 109, a tantalum layer 112 and tantalum oxide layers 111a and 111b are laminated. The tantalum oxide layer 111c is a region that is formed simultaneously with the production step of the anodic oxide of a porous type 109. The regions 111a and 111b are regions that are formed simultaneously with the production step of the anodic oxide of a barrier type 110. The region 111a invades under the anodic oxide 109 by a length of from 5 to 20 nm. The region 111b becomes tantalum oxide containing Al, or an oxide of an alloy of Ta and Al. The region 111c has a lower denseness than the region 111a.

The tantalum oxide is removed using the anodic oxide film of a porous type as a mask. (FIG. 2E) While the surface of the second gate insulating film may be slightly etched depending on the etching conditions, it is not shown in the figure for simplicity. The etching may go around the anodic oxide 109 to slightly invade under the anodic oxide depending on the etching conditions, it is not shown in the figure for simplicity.

Maintaining the state in that the surface of the active layer 104 is covered with the gate insulating films 102b and 102c, an impurity ion giving a conductivity is added to the active layer to form impurity regions of P-type and N-type 113 and 114 to be a source region and a drain region. (FIG. 3A) The addition of the ion can be conducted by known method, such as an ion implantation method, a plasma doping method and a laser doping method. In this step, the doping conditions, the dose amount and the acceleration voltage are so adjusted that the impurity ion is added to the active layer passing through the first and second gate insulating films. In this embodiment, an example using boron as an impurity giving a P-type conductivity and phosphorous as an impurity giving an N-type conductivity is specifically described.

Figure 3A:
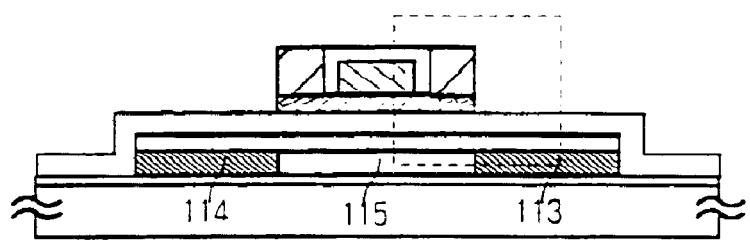
FIGS. 3A to 3E are cross sectional views showing an embodiment of the production method according to the invention.
Figure 3B:
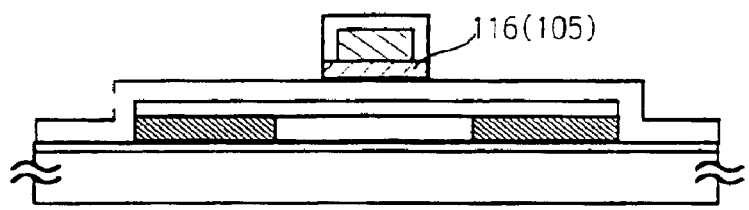
Figure 4B:
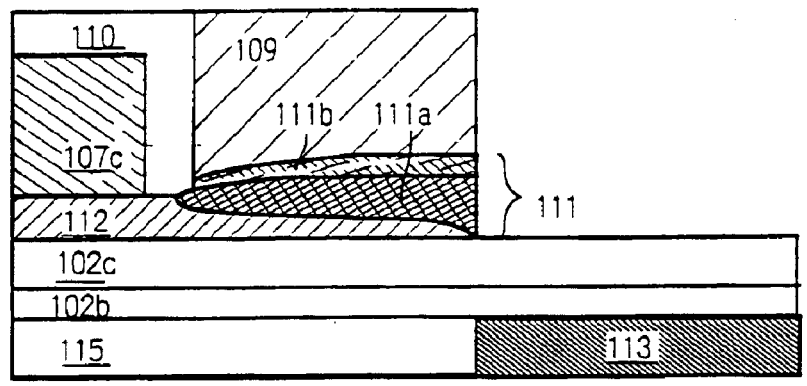

FIG. 4B is an enlarged cross sectional view of the area surrounded with dotted lines in FIG. 3A. In the case where this structure is maintained as it is, the TFT is liable to be deteriorated or broken because a voltage is applied as concentrated to an edge of the Ta layer 112 present under the anodic oxides 109 and 111 on the TFT in an on state. Therefore, it is preferred that the Ta layer 112 present under the anodic oxides 109 and 111 is selectively removed or oxidized.

Accordingly, in the invention, the anodic oxide 109 of a porous type is removed with the gate insulating films 102b and 102c maintained as covering the surface of the active layer, and then the tantalum oxide and the tantalum film present under the region 109 are removed by dry etching using CHF3. (FIG. 3B) In the constitution of the invention, because the second gate insulating film functions as an etching stopper to protect the active layer, plural etching treatments can be conducted. At this time, while the surface of the second gate insulating film may be slightly etched, it is not shown in the figure for simplicity. The etching may go around the anodic oxide 110 to slightly invade into the regions 111 and 112 depending on the etching conditions, it is not shown in the figure for simplicity.

An impurity ion giving a conductivity is again added to the active layer to form low concentration impurity regions of a P-type and an N-type 117 and 118. (FIG. 3C) The addition of the ion can be conducted by known method, such as an ion implantation method, a plasma doping method and a laser doping method. A first wiring layer 116 functions as a mask, a region of a lower part of the gate wiring becomes a channel forming region 119.

A heat treatment at a temperature of from 500 to 650° C. is conducted for from 0.1 to 12 hours. (FIG. 3D) The heat treatment provides an effect of activating the impurity in the source region and the drain region, an effect of recovering the crystalline structure damaged during the doping step, and an effect of lowering the concentration of the catalytic element in the channel forming region by utilizing the source region and the drain region added with phosphorous as a gettering sink. In this embodiment, nickel moves to be gettered from the channel forming region directly under the gate wiring to the source region and the drain region, in the direction shown by an arrow in FIG. 3D.

Figure 3C:
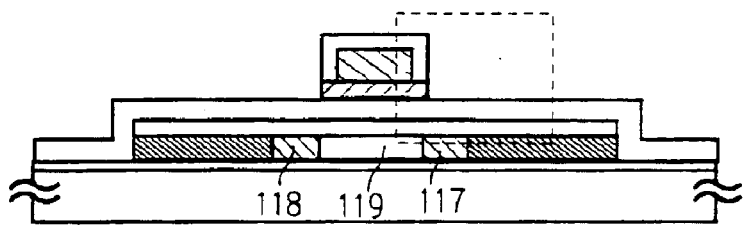
Figure 3D:
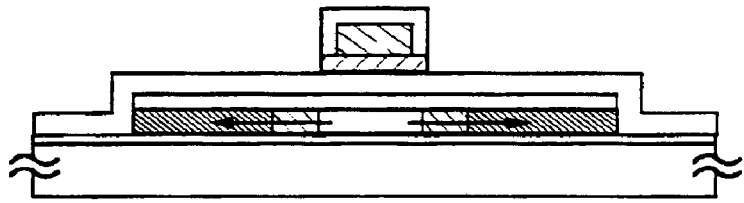
Figure 4C:
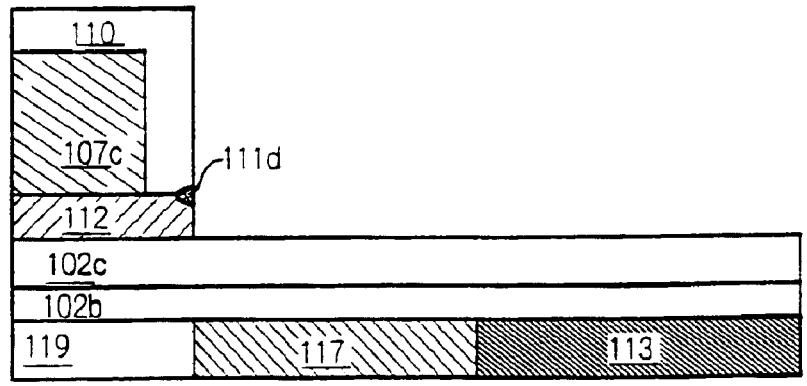

FIG. 4C is an enlarged cross sectional view of the area surrounded with dotted lines in FIG. 3C. An anodic oxide 111d is a part of the anodic oxide 111a. As shown in the figure, the surface of the active layer has a structure of covering with the first gate insulating film 102b and the second gate insulating film 102c.

Finally, after forming an interlayer insulating film 120, contact holes for exposing the source region and the drain region are formed, and a metallic layer is formed. The metallic layer is then patterned to form metallic wirings 121 and 122 in contact with the source region and the drain region, respectively. (FIG. 3E) This, the production of the TFT in this embodiment according to the invention is accomplished.

Figure 3E:
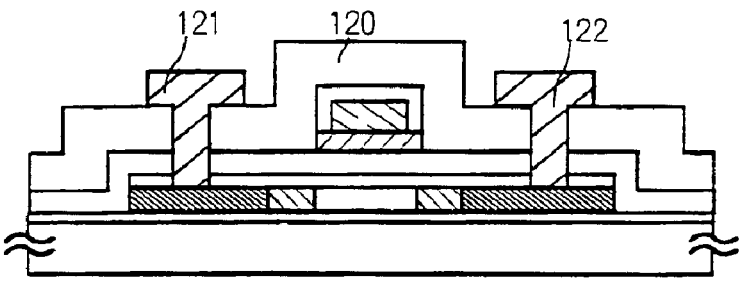

FIGS. 5A to 5C are a plan view and cross sectional views in FIG. 3E. FIG. 3E is the same as FIG. 5B, and the cross sectional structural view along the line Z–Z' in FIG. 5B corresponds to FIG. 5A. The plan shape shown in FIG. 5A is simplified to a rectangular shape. The cross sectional structural view along the line X–X' in FIG. 5A corresponds to FIG. 5B, and the cross sectional structural view along the line Y–Y' in FIG. 5A corresponds to FIG. 5C.

The invention will be described with reference to the following examples, but the invention is not construed as being limited thereto.

EXAMPLE 1

An example of a structure of a semiconductor device having a semiconductor circuit comprising a semiconductor element utilizing the invention will be described with reference to FIGS. 10A and 10B. The semiconductor device according to the invention comprises a peripheral driving circuit part and a pixel matrix circuit part formed on one substrate. In this example, for simplicity of the drawings, a CMOS circuit constituting a part of the peripheral driving circuit part and a pixel TFT (N-channel TFT) constituting a part of the pixel matrix circuit are shown on one substrate.

Figure 9:
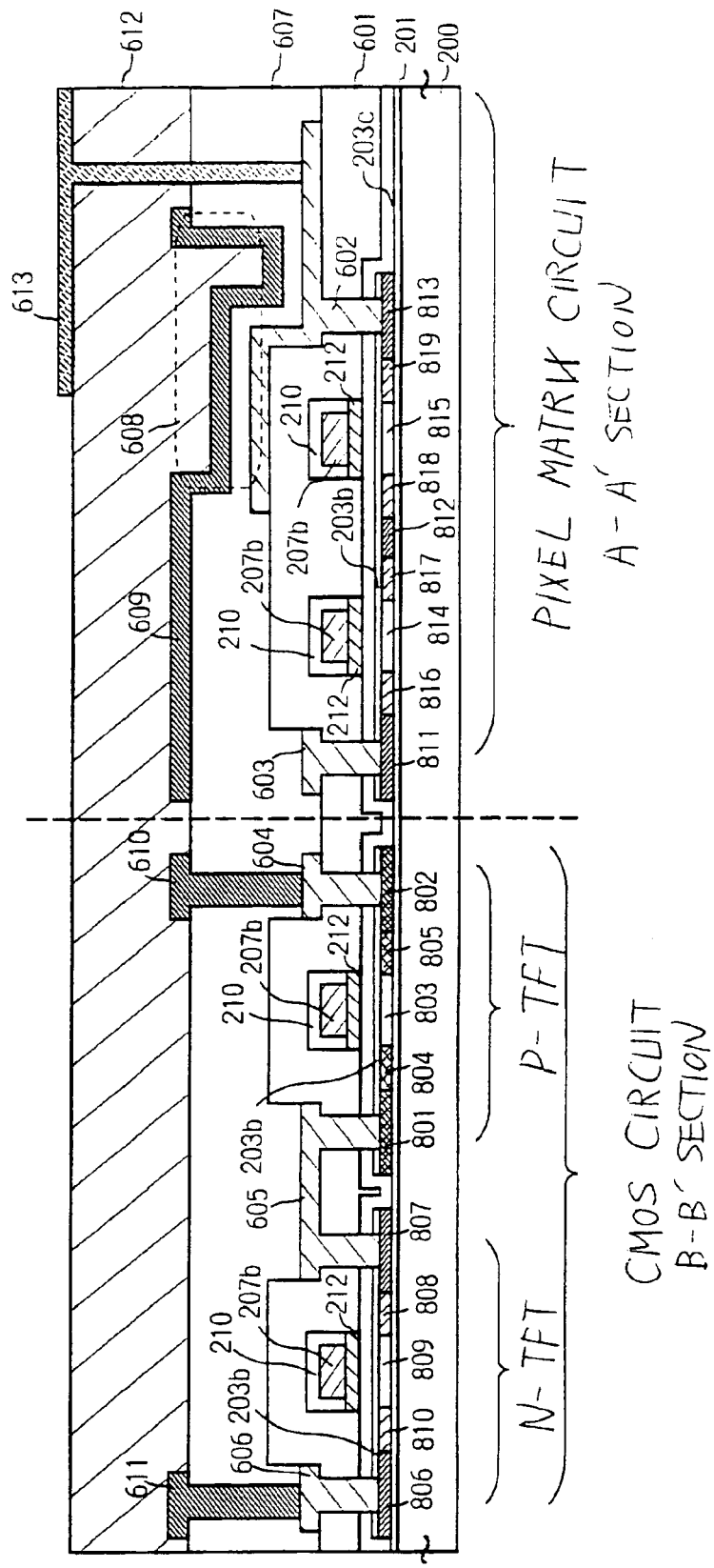
FIG. 9 is a cross sectional view showing an example of the production method according to the invention.
Figure 10A:
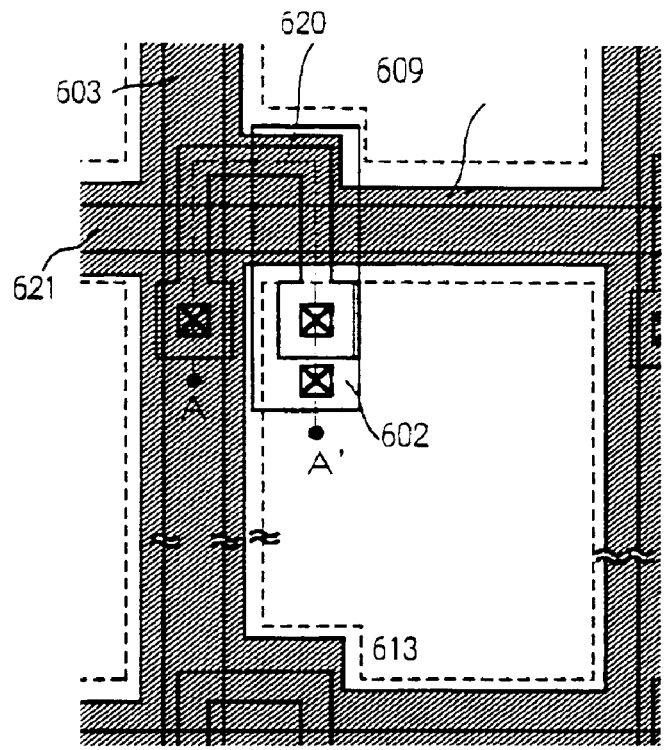
FIGS. 10A and 10B are plan views showing a pixel matrix circuit and a CMOS circuit.
Figure 10B:
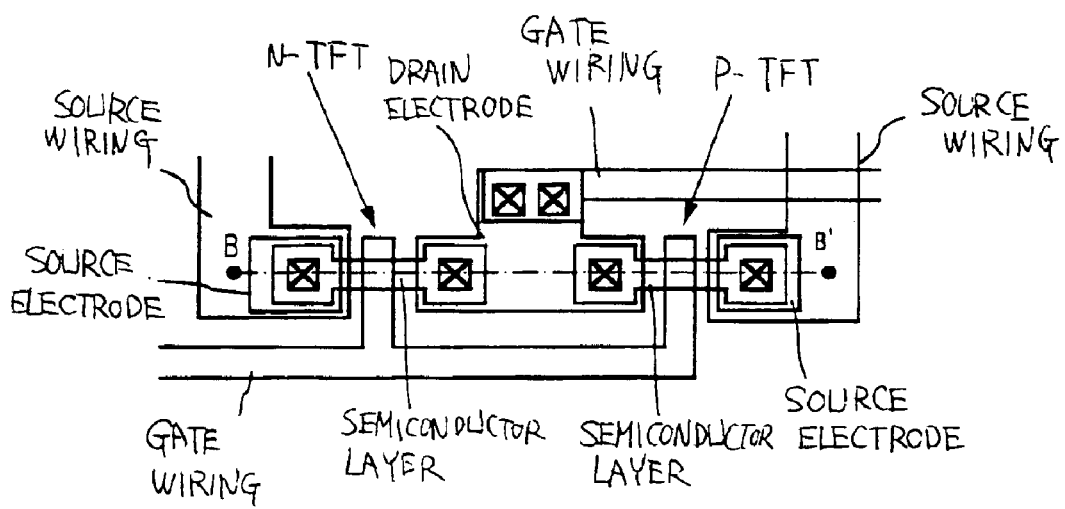
Figure 11:
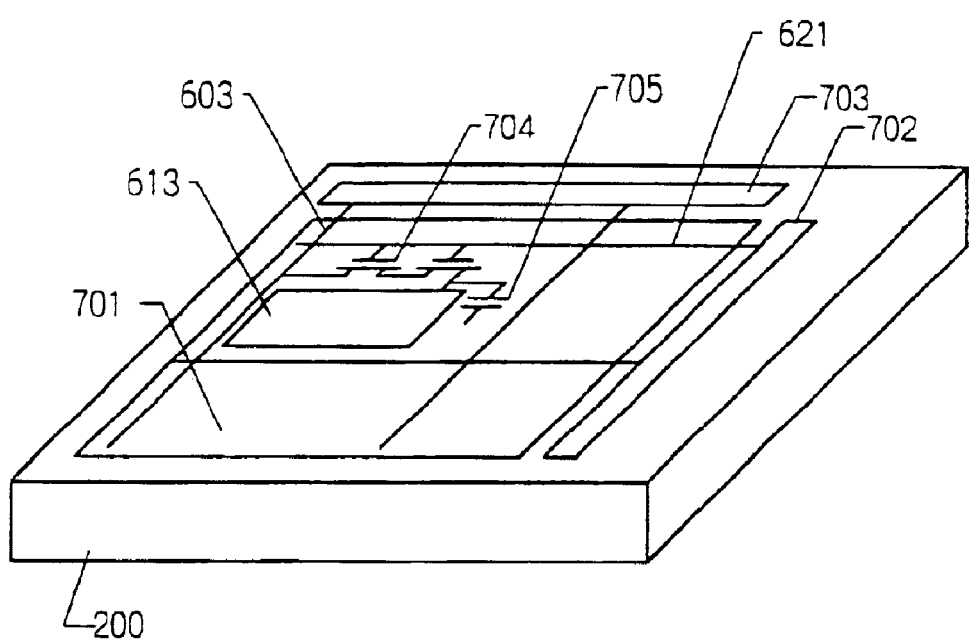
FIG. 11 is a perspective appearance view showing an active matrix substrate.

FIGS. 10A and 10B are upper plan views corresponding to FIGS. 6A to 6D, 7A to 7C, 8A to 8C and 9. A part cut along the dotted line A–A' in FIG. 10A corresponds to the cross sectional structure of the pixel matrix circuit of FIGS. 6A to 6D, 7A to 7C, 8A to 8C and 9, and a part cut along the line B–B' in FIG. 10B corresponds to the cross sectional structure of the CMOS circuit of FIGS. 6A to 6D, 7A to 7C, 8A to 8C and 9, respectively. FIG. 11 is a schematic perspective view of an active matrix substrate comprising a peripheral driving circuit part and a pixel matrix circuit part on one substrate. The active matrix substrate comprises a substrate 200 having thereon a pixel matrix circuit 701, a scanning line driving circuit 702 and a signal line driving circuit 703, and the scanning line driving circuit 702 and the signal line driving circuit 703 are connected to the pixel matrix circuit 701 by a scanning line 621 and a signal line 603, respectively. In the vicinity of a point of intersection of the scanning line and the signal line, a pixel TFT 704 connected to the lines is formed, to which a pixel electrode 613 and an auxiliary capacitance 705 are connected.

The both TFTs (thin film transistors) in FIG. 9 are formed on an underlayer film 201 provided on a substrate 200. In the case of a P-channel TFT of the CMOS circuit, P-type high concentration impurity regions (a source region and a drain region) 801 and 802, a channel forming region 803, and low concentration impurity regions 804 and 805 between the high concentration impurity regions and the channel forming region are formed as an active layer. On the channel forming region, a gate wiring is formed through a laminated film of a first gate insulating film 203*b* and a second gate insulating film 203*c*. The gate wiring has a laminated structure comprising a first wiring layer 212 and a second wiring layer 207*b*, and the second wiring layer is protected by an anodic oxide of a barrier type 210. In a first interlayer insulating film 601 covering thereover, contact holes are formed to connect wirings 604 and 605 to the high concentration impurity region, and a second interlayer insulating film 607 is formed further thereon. A lead wiring 610 is connected to the wiring 605, and a third interlayer insulating film 612 is formed to cover the same.

In the N-channel TFT, N-type high concentration impurity regions (a source region and a drain region) 806 and 807, a channel forming region 809, and low concentration impurity regions 808 and 810 between the high concentration impurity regions and the channel forming region are formed as an active layer. Wirings 605 and 606 are connected to the high concentration impurity region, and a lead wiring 611 is connected to the wiring 606. The structure other than the active layer is the same as the P-channel TFT described above.

The N-channel TFT formed in the pixel matrix circuit has the same structure as the N-channel TFT of the CMOS circuit until the part where the first interlayer insulating film is formed. A wiring 603 is connected to a high concentration impurity region 811, and a wiring 602 is connected to a high concentration impurity region 813. A second interlayer insulating film is formed thereon, and a black mask 609 is then formed. The black mask covers the pixel TFT, and forms an auxiliary capacitance with the wiring 602. A third interlayer insulating film 612 is further formed thereon, and a pixel electrode 613 comprising a transparent conductive film, such as ITO, is connected. A ZnOx film, a InZnOx, or a film comprising alloy metals can be used as a pixel electrode. In this example, while the gate electrode of the pixel TFT of the pixel matrix circuit has a double gate structure, it may be a multi-gate structure, such as a triple gate structure, to suppress unevenness of an off electric current. It may be a single gate structure to increase an opening ratio.

In the structure of the invention, the concentration of the impurity (such as carbon, nitrogen, oxygen, Na, Fe, Cr, Al and Ta) at the interface between the channel forming region and the first gate insulating film is lower than the concentration of the impurity at the interface between the first gate insulating film and the second gate insulating film. In particular, the concentration of the impurity can be controlled in such a manner that the concentration of the impurity, such as carbon, nitrogen and oxygen, at the interface between the channel forming regions 803, 809, 814 and 815 of the respective TFTs and the first gate insulating film 203*b* is from $1 \times 10^{19}$ atoms/cm$^3$ or less, and preferably $1 \times 10^{16}$ atoms/cm$^3$ or less. The concentration of an alkali metal impurity (such as Na) and a metal impurity (such as Fe and Cr) can be controlled to $1 \times 10^{15}$ atoms/cm$^3$ or less. The concentration of the catalytic element (Ni) used on crystallization can be $5 \times 10^{17}$ atoms/cm$^3$. The concentrations of the impurities herein can be defined by the lowest value of the SIMS data.

The method for manufacturing a semiconductor device according to the invention will be described in detail with references to FIGS. 6A to 6D, 7A to 7C, 8A to 8C and 9 below.

A substrate 200 having an insulating surface is prepared. In this example, a glass substrate (Corning 1737, distortion point: 667° C.) was used as the substrate 200. A silicon oxide film having a thickness of 200 nm was formed on the surface of the substrate as an underlayer film 201. A nickel acetate solution was coated by using a spinner and dried to form a Ni layer 21. (FIG. 6A) The Ni layer does not form a complete layer. The Ni concentration of the nickel acetate solution is from 1 to 1,000 ppm in weight conversion. In this example, it was 100 ppm. In this state, Ni is maintained on the surface of the underlayer film. While a coating method using a solution is used in this example, Ni can be maintained on the surface of the underlayer film by an ion implantation method or a sputtering method.

An amorphous silicon film 202 and a first gate insulating film 203*a* are continuously formed. (FIG. 6B) In this example, a chamber for forming the amorphous silicon film and a chamber for forming the gate insulating film are provided, and they are continuously formed by transferring the substrate among the chambers with maintaining high vacuum. In this example, the amorphous silicon film having a thickness of 50 nm was formed by a reduced pressure thermal CVD method using disilane ($Si_2H_6$) as a film forming gas, and the first gate insulating film comprising an oxide film having a thickness of 20 nm was formed by a reduced pressure thermal CVD method. The concentration of the impurity, such as carbon, nitrogen and oxygen, in the amorphous silicon film 202 is controlled to $5 \times 10^{18}$ atoms/cm$^3$ or less.

While maintaining the first gate insulating film 203*a* on the surface, the amorphous silicon film 202 is crystallized by irradiating with an ultraviolet ray or an infrared ray (laser crystallization) to obtain a crystalline silicon film 204. (FIG. 6C) The laser crystallization may be continuously conducted without exposing to the air. In this example, XeCl laser light (=308 nm) was used. In this example, pulse laser light was irradiated under the crystallization condition in that the semiconductor film having an amorphous substance was not melted to promote crystal growth from the catalytic element, so as to obtain a crystalline semiconductor film. In the crystallization step, nucleus formation from nickel silicide as a nucleus occurs, and the nucleus then grows to crystallize the whole of the film.

The crystalline silicon film and the first gate insulating film are patterned by a dry etching method to form an active layer 205 and a first gate insulating layer 203*b* as shown in FIG. 6D.

A second gate insulating film 203*c* having a thickness of 100 nm is formed to cover the whole surface of the substrate, and then a laminated film of a Ta film 206 having a thickness of 20 nm as a first conductive film and an Al film containing 2% by weight of scandium having a thickness of 40 nm as a second conductive film is formed. A resist mask 208 is formed, and the Al film is patterned, to form a second wiring layer 207*a*. (FIG. 7A)

With the resist mask 208 remaining, a probe of an anodic oxidation device is made in contact with the Ta film to conduct the first anodic oxidation. The anodic oxidation conditions were a 3% oxalic acid aqueous solution (temperature: 10° C.) used as an electrolytic solution, a reached voltage of 8 V, a voltage application time of 40 minutes, and a supplied electric current of 20 mA per substrate. An anodic oxide of a porous type 209 was formed through this step. After removing the resist mask 208, the probe of the anodic oxidation device was again made in contact with the Ta film to conduct the second anodic oxidation. The anodic oxidation conditions were an ethylene glycol solution containing 3% of tartaric acid used as an electrolytic solution, a temperature of the electrolytic solution of 10C, a reached voltage of 80 V, a voltage application time of 30 minutes, and a supplied electric current of 30 mA per substrate. An anodic oxide of a barrier type 210 and a tantalum oxide 211 were formed through this step. (FIG. 7B) While the thickness of the region where tantalum oxide is formed is actually increased, it is not shown in the figure for simplicity.

After removing the tantalum oxide by etching using an oxygen series etchant gas, such as $CF_4O$, phosphorous as an impurity ion giving an N-type conductivity was added to the active layer by passing through the gate insulating films 203*b* and 203*c* by an ion implantation method. The N-channel TFT was then covered with a resist film, and boron as an impurity giving a P-type conductivity was added to the active layers 217 and 218 by an ion implantation method. (FIG. 7C) The dose amount of boron is such an amount that the concentration of boron in the P-type impurity regions 217 and 218 is from 1.3 to 2 times the concentration of phosphorous added to the N-type impurity regions 213 to 215, 220 and 221. As the method for adding a phosphorous ion or a boron ion in this example, known method can be employed, such as an ion implantation method, a plasma doping method, a method where a solution containing a phosphorous ion or a boron ion is coated, followed by drying, and a method where a film containing a phosphorous ion or a boron ion is formed, followed by heating. When the tantalum oxide is removed by etching in the step described above, the second gate insulating film functions as an etching stopper.

The anodic oxide of a porous type 209 is removed by a known method. (FIG. 8A) After an etching treatment using a fluorine series etchant gas (such as CHF3) is conducted to remove a part shown by numeral 212 present under the anodic oxide 209, an impurity is added to a lower concentration than the impurity concentration in the step shown in FIG. 7C through the gate insulating film as in the same manner as the step of adding an impurity described above, so as to form low concentration impurity regions having an N-type conductivity 306 to 309, 404 and 405 and a low concentration impurity regions having an P-type conductivity 504 and 505. (FIG. 8B) On etching in the step described above, the second gate insulating film functions as an etching stopper.

The concentration of phosphorous is adjusted to the range of from $1 \times 10^{20}$ to $8 \times 10^{21}$ atoms/cm$^3$ in the N-type high concentration impurity region, and the range of from $1 \times 10^{15}$ to $1 \times 10^{17}$ atoms/cm$^3$ in the N-type low concentration impurity region. The region, to which neither a phosphorous ion nor a boron ion is added, becomes an intrinsic or substantially intrinsic channel forming region to be a migration path of a carrier.

The term, an intrinsic region, used herein means a region containing no impurity that is capable of changing the Fermi level of silicon, and the term, a substantially intrinsic region, used herein means a region, in which an electron and a hole are completely balanced to offset the conductive type, i.e., a region containing an impurity giving an N-type or a P-type in a concentration range (from $1 \times 10^{15}$ to $1 \times 10^{17}$ atoms/cm$^3$) where the threshold value can be controlled, or a region where the conductive type is offset by intentionally adding an impurity of the reverse conductive type.

A heat treatment is then conducted in an inert atmosphere or a dry oxygen atmosphere at 450° C. or more for from 0.5 to 12 hours. In this example, the heat treatment was conducted at 550° C. for 2 hours. (FIG. 8C).

Through the heat treatment described above, Ni intentionally added to crystallize the amorphous silicon film is diffused from the channel forming region to the source region and the drain region, respectively, as shown by the arrows in FIG. 8C. This is because these regions contain a phosphorous element in a high concentration, and Ni reaching the source region and the drain region is caught at these regions (gettering). The gettering of Ni can be sufficiently conducted by a heat treatment at a temperature of from 400 to 600° C. for from 0.5 to 4 hours.

As a result, the Ni concentration in the channel forming region can be decreased. The Ni concentrations of the channel forming regions 304, 305, 403 and 503 can be lowered to a value lower than $5 \times 10^{17}$ atoms/cm$^3$, the lower detection limit of SIMS. The Ni concentration of the source region and the drain region used as a gettering sink is increased to a value higher than the channel forming region.

A first interlayer insulating film is formed with a silicon oxide film on the whole surface of the substrate. In this example, a first interlayer insulating film 601 having a thickness of 1 μm is formed by a CVD method. Examples of other materials of the interlayer insulating film include a silicon nitride film, a silicon oxinitride film and a transparent organic resin film, such as an acrylic resin, polyimide and BCB (benzocyclobutene).

Contact holes are then formed, and a metallic film for conducting silicidation is selectively formed. A heat treatment is conducted to make the regions 811 to 813, 802, 801, 806 and 807 into silicide, and only the metallic film is removed. By adding this step, the resistance of the contact can be lowered to realize an operation frequency on a level of several GHz. Examples of the metallic film to be subjected to silicidation include a film comprising a material mainly comprising cobalt, titanium, tantalum, tungsten and molybdenum. A metallic film not shown in the figure for forming a contact electrode is formed. In this example, a three-layer film of a titanium film, an aluminum film and a titanium film is formed as the metallic film by a sputtering method. Wirings 602 to 606 are formed by patterning the metallic film. While a step of silicidation is added in this example, it may be omitted.

An organic resin film having a thickness of 1 μm as a second interlayer insulating film 125 is formed by a spin coating method. In order to form an auxiliary capacitance, a prescribed part 608 is thinned by etching. A metallic film having a thickness of 300 nm comprising Ti is then formed. A black mask 609 and lead wirings 610 and 611 are formed by patterning the metallic film.

A third interlayer insulating film 612 is formed with an acrylic resin. In this example, a third interlayer insulating film 612 having a thickness of 1 μm is formed by spin coating method. In the case where a resin film is used, the surface thereof can be flattened as shown in the figure.

Contact holes are formed, and a pixel electrode 613 is formed. In this example, an ITO film having a thickness of 100 nm is formed by a sputtering method, and a pixel electrode 613 is formed by patterning the ITO film. A ZnOx film, a InZnOx, or a film comprising alloy metals can be used as a pixel electrode.

A heat treatment in a hydrogen atmosphere at 350° C. is conducted for 1 hour to decrease defects in the semiconductor layer. As a result, the state shown in FIG. 9 is obtained.

The TFT structure shown in this example is one example of a top gate type, and the invention is not construed as being limited to the structure of this example. It is easy to apply the invention to a bottom gate type. While a transmission type LCD is produced in this u example, it is a mere example of the semiconductor device. By forming the pixel electrode with a metallic film having a high reflective index instead of ITO, and appropriately changing the patterning of the pixel electrode by the practician, a reflection type LCD can be easily produced. In the case where a reflection type LCD is produced, when a structure comprising a heat resistant metallic film having laminated thereon an insulating film, or a structure comprising aluminum nitride having laminated thereon an insulating film is used as the underlayer film, it is effective since the metallic film under the insulating film functions as a radiation layer. The order of the steps described above can be appropriately changed by the practician.

EXAMPLE 2

In this example, a crystalline silicon film is obtained in a method different from Example 1. In the step of continuously forming an initial semiconductor film and a first gate insulating film in this example, the first gate insulating film is formed at a film forming temperature of from 400 to 500° C., and then a crystalline silicon film is obtained by a laser crystallization treatment. Since the basic constitution of this example is the same as Example 1, only the differences from Example 1 are described herein.

In this example, a catalytic element (Ni) is maintained by coating a solution containing the catalytic element on the surface of an underlayer film. The Ni concentration of the nickel acetate solution is from 50 to 500 ppm, and preferably from 100 to 200 ppm, in weight conversion. In this example, the concentration was 100 ppm. Under this state, Ni is maintained on the surface of the underlayer film. Thereafter, an initial semiconductor film (an amorphous silicon film having a thickness of 50 nm formed by RF-PCVD) and a first gate insulating film were continuously formed. The film formation temperatures for these films are from 400 to 500° C. In this example, they were controlled to the same temperature, 450° C. By employing such a film forming temperature, a heat treatment of the underlayer film and a treatment of reducing the hydrogen concentration in the semiconductor film having an amorphous substance were simultaneously conducted with the film formation. Furthermore, at the same time of the film formation of the first gate insulating film, nucleus growth in the semiconductor film having an amorphous substance was conducted. By employing the same film formation giving, a stress between the films laminated could be relaxed.

Thereafter, laser light was irradiated through the first gate insulating film, and thus crystallization of the whole film promptly proceeded to obtain a crystalline silicon film. Irradiation of high-intensity light, such as RTA and RTP, may be used instead of the irradiation of laser light. In this example, the crystalline silicon film was obtained by using excimer laser light having a wavelength of 308 nm. In Example 1, pulse laser light was irradiated under the conditions in that the semiconductor film having an amorphous substance was not melted to grow crystals, so that the crystalline semiconductor film was obtained.

The subsequent steps are the same as in Example 1, and therefore descriptions thereof are omitted. As a result, a TFT having excellent TFT characteristics was produced.

EXAMPLE 3

In this example, a crystalline silicon film is obtained in a method different from Example 1. In this example, the shape of a laser beam is formed into a rectangular shape or a square shape, and a uniform laser crystallization treatment is applied to an area of from several to several hundred cm2 per one time irradiation. Since the basic constitution of this example is the same as Example 1, only the differences from Example 1 are described herein.

In this example, after forming an underlayer film, a catalytic element (Ni) is maintained by coating a solution containing the catalytic element on the surface of the underlayer film. The Ni concentration of the nickel acetate solution is from 1 to 1,000 ppm in weight conversion. In this example, the concentration was 100 ppm. Under this state, Ni is maintained on the surface of the underlayer film. An initial semiconductor film and a first gate insulating film were then continuously formed. Thereafter, excimer laser light (wavelength: 248 to 308 nm) was irradiated in an inert or acidic atmosphere to obtain a crystalline silicon film. A heat treatment may be simultaneously conducted. Irradiation of high-intensity light, such as RTA and RTP, may be used instead of the irradiation of laser light.

In this example, the shape of a laser beam having a wavelength of 248 nm was shaped into a rectangular shape or a square shape, and a uniform laser device (SAELC produced by SOPRA) was applied to an area of from several to several hundred cm2 per one time irradiation, to obtain a crystalline silicon film. Since the laser device can conduct an annealing treatment on a large area by a single shot, and has a large output energy, nucleus growth and crystallization of the whole film can be conducted. In this example, pulse laser light was irradiated under the conditions in that the amorphous semiconductor film was melted to conduct crystal growth from the catalytic element, so that a crystalline semiconductor film was obtained.

The subsequent steps are the same as in Example 1, and therefore descriptions thereof are omitted. As a result, a TFT having excellent TFT characteristics was produced.

This example and Example 2 may be combined.

EXAMPLE 4

In this example, a low concentration impurity region (LDD region) is formed in a method different from Example 1. In this example, in a step after removing the anodic oxide 109, heating is conducted at a heating temperature of from 450 to 650° C. for from 0.5 to 5 hours, so that the whole of the Ta film present under the anodic oxide 109 is subjected to thermal oxidation. Since the basic constitution of this example is the same as Example 1, only the differences from Example 1 are described herein.

The descriptions of the steps until that shown in FIG. 3A are omitted since they are the same as Example 1. After obtaining the state shown in FIG. 3A and removing the anodic oxide 109, heating was conducted at a heating temperature of 450° C. for 2 hours, so that the whole of the exposed Ta film after removing the anodic oxide 109 was subjected to thermal oxidation to be modified into tantalum oxide. Accordingly, a constitution in that the Ta film under 109C is protected by tantalum oxide is obtained.

Thereafter, an impurity giving a conductive type was added to the active layer through the tantalum oxide and the first and second gate insulating films. While addition of an impurity ion was conducted twice in this example, it is preferred that the high concentration impurity region and the low concentration impurity region are simultaneously formed by one time addition of an impurity ion since the process can be shortened.

The subsequent steps are the same as in Example 1, and therefore descriptions thereof are omitted. As a result, a TFT having excellent TFT characteristics was produced.

This example and Examples 2 and 3 may be combined.

EXAMPLE 5

In this example, a first gate insulating film is formed in a method different from Example 1. Since the basic constitution of this example is the same as Example 1, only the differences from Example 1 are described herein.

In this example, a layer containing a catalytic element is formed on the underlayer film, and a semiconductor film having an amorphous substance is obtained, which is then oxidized without exposing to the air to continuously form a first gate insulating film comprising an oxide film.

In this example, a solution containing nickel was coated on the underlayer film, and immediately after forming an amorphous silicon film thereon, it was subjected to plasma oxidation by using an oxygen gas added with He without exposing to the air, to continuously form the first gate insulating film. In these steps, the film formation is preferably conducted at a temperature in a range of 450° C.±20° C. Furthermore, an insulating film may be laminated thereon by a PCVD method to constitute a first gate insulating film having a multi-layer structure. Since the first gate insulating film is obtained by oxidizing the amorphous silicon film, an Si—SiO$_2$ interface in an extremely good condition can be obtained.

The subsequent steps are the same as in Example 1, and therefore descriptions thereof are omitted. As a result, a TFT having excellent TFT characteristics was produced.

This example and Examples 2 to 4 may be combined.

EXAMPLE 6

In this example, a crystalline silicon film and a first gate insulating film are formed in a method different from Example 1. In this example, after forming a layer containing a catalytic element (Ni) on a substrate, a microcrystalline semiconductor film is formed as an initial semiconductor film, and a first gate, insulating film is continuously formed (plasma oxidation by using an oxygen gas added with He). In this step, the first gate insulating film is formed at a temperature of from 400 to 500° C., and then a crystalline silicon film is obtained by a laser crystallization treatment. Since the basic constitution of this example is the same as Example 1, only the differences from Example 1 are described herein.

In this example, a silicon film having an amorphous substance containing microcrystals and a first gate insulating film (a silicon is oxide film obtained by plasma oxidation by using an oxygen gas added with He) were continuously formed. A silicon oxinitride film obtained by plasma nitriding may be used as the first gate insulating film.

Thereafter, when laser light was irradiated through the first gate insulating film, crystallization of the whole film occurred from the microcrystals in the film, and thus a crystalline silicon film was obtained. Irradiation of high-intensity light, such as RTA and RTP, may be used instead of the irradiation of laser light. In this example, excimer laser light having a wavelength of 308 nm was used to obtain the crystalline silicon film. In Example 1, pulse laser light was irradiated under the conditions in that the semiconductor film having an amorphous substance was not melted to grow crystals, so that the crystalline semiconductor film was obtained.

The subsequent steps are the same as in Example 1, and therefore descriptions thereof are omitted. As a result, a TFT having excellent TFT characteristics was produced.

This example and Examples 2 to 5 may be combined.

EXAMPLE 7

In this example, a first gate insulating film and a second gate insulating film are formed in a method different from Example 1. Since the basic constitution of this example is the same as Example 1, only the differences from Example 1 are described herein.

In this example, after adding a catalytic element (Ni) to an underlayer film, a semiconductor film having an amorphous substance and a first gate insulating film (silicon nitride film) are continuously formed. Thereafter, a crystalline silicon film is obtained by a laser crystallization treatment,. and then a second gate insulating film (silicon oxide film) is formed. In this example, a first gate insulating film comprising silicon nitride (SiNx) was formed from SiH$_4$, NH$_3$ and N2 as a reaction gas by a PCVD method, and after the irradiation of laser light, a second gate insulating film was formed from TEOS and oxygen as a reaction gas by a PCVD method. A silicon oxinitride film (SiOxNy) may be formed. A gate insulating film comprising a laminated body of three or more layers may be formed.

After forming the second gate insulating film, the second gate insulating film was removed but the first gate insulating film remained in a region of a circuit in that high speed operation took first preference. At this time, since the etching ratios are different between the first gate insulating film and the second gate insulating film, only the second gate insulating film can be easily removed by using the first gate insulating film as an etching stopper. In a region of a circuit in that high voltage resistance takes first preference, the first gate insulating film and the second gate insulating film are laminated.

When the gate insulating film is constituted with a laminated body comprising films having different properties, interface characteristics between the crystalline silicon film and the first gate insulating film can be good, and the voltage resistance of the gate insulating film of the TFT can be selectively increased.

The subsequent steps are the same as in Example 1, and therefore descriptions thereof are omitted. As a result, TFTs having gate insulating films having different thickness can be produced on one substrate.

This example and Examples 2 to 6 may be combined.

EXAMPLE 8

A CMOS circuit and a pixel matrix circuit produced by practicing the invention can be used in various electro-optical device (such as an active matrix type liquid crystal display, an active matrix type EL display and an active matrix type EC display). Therefore, the invention can be practiced in any electronic device having those electro-optical device as a display medium installed therein.

Examples of the electronic device include a video camera, a digital still camera, a projection display (a rear projection type and a front projection type), a head-mounted display (a goggle-like display), a car navigation system, a personal computer and a portable information terminal (such as a mobile computer, a cellular phone and an electronic book). Examples thereof are shown in FIGS. 12A to 12F and 13A to 13D.

FIG. 12A shows a personal computer, which comprises a main body 2001, an image receiving part 2002, a display device 2003 and a keyboard 2004. The invention can be applied to the image receiving part 2002, the display device 2003 and other signal processing circuits.

FIG. 12B shows a video camera, which comprises a main body 2101, a display device 2102, a voice receiving part 2103, an operation switch 2104, a battery 2105 and an image receiving part 2106. The invention can be applied to the display device 2102, the voice receiving part 2103 and other signal processing circuits.

FIG. 12C shows a mobile computer, which comprises a main body 2201, a camera part 2202, an image receiving part 2203, an operation switch 2204 and a display device 2205. The invention can be applied to the display device 2205 and other signal processing circuits.

FIG. 12D shows a goggle-like display, which comprises a main body 2301, a display device 2302 and an arm part 2303. The invention can be applied to the display device 2302 and other signal processing circuits.

FIG. 12E shows a player for a recording medium in which a program is recorded (hereinafter referred to as a recording medium), which comprises a main body 2401, a display device 2402, a speaker part 2403, a recording medium 2404 and an operation switch 2405. In this device, a DVD (digital versatile disk) and a CD are used as the recording medium to play music, movies and games, and to access the Internet. The invention can be applied to the display device 2402 and other signal processing circuits.

FIG. 12F shows a digital still camera, which comprises a main body 2501, a display device 2502, an eyepiece 2503, an operation switch 2504 and an image receiving part (not shown in the figure).

The invention can be applied to the display device 2502 and other signal processing circuits.

Figure 13A:
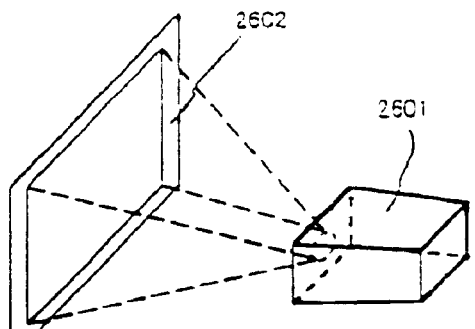
FIGS. 13A to 13D are perspective views and cross sectional views of examples of an electric device.

FIG. 13A shows a front projection display, which comprises a display device 2601 and a screen 2602. The invention can be applied to a display device and other signal processing circuits.

Figure 13B:
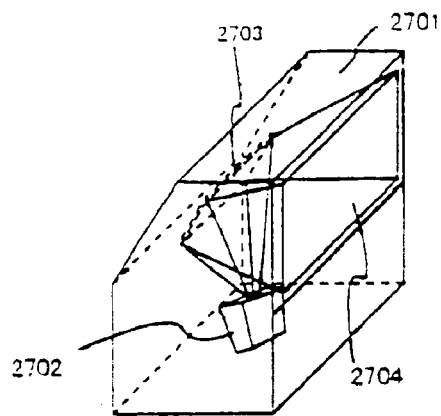

FIG. 13B shows a rear projection display, which comprises a main body 2701, a display device 2702, a mirror 2703 and a screen 2704. The invention can be applied to a display device and other signal processing circuits.

Figure 13C:
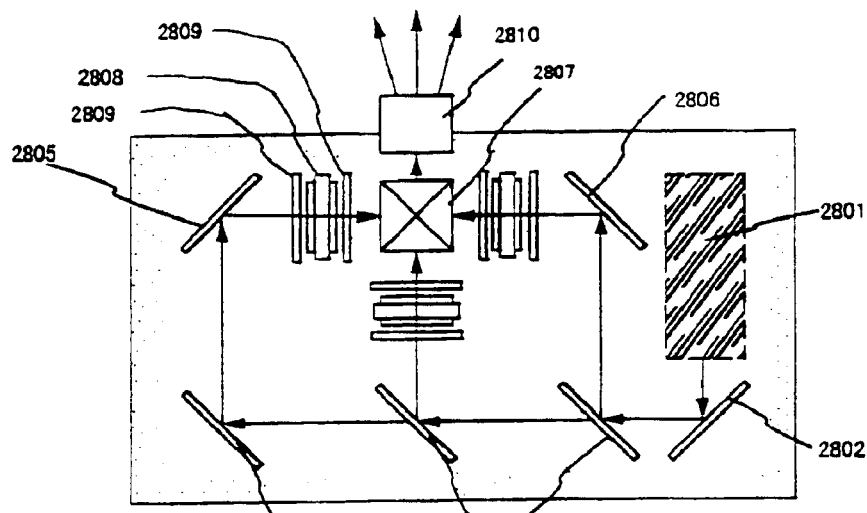

FIG. 13C shows an example of a structure of the display device 2601 and 2702 shown in FIGS. 13A and 13B. The display device 2601 and 2702 comprises a light source optical system 2801, mirrors 2802 and 2804 to 2806, a dichroic mirror 2803, a prism 2807, a liquid crystal display device 2808, a retardation plate 2809 and a projection optical system 2810. The projection optical system 2810 is constituted with an optical system comprising a projection lens. While a three-plate system is exemplified in this example, it is not limited thereto but a single plate system may be employed. Furthermore, on the light path shown by the arrow in FIG. 13C, an optical system, such as an optical lens, a film having a polarizing function, a film for adjusting phase difference and an IR film, may be provided by the practician.

Figure 13D:
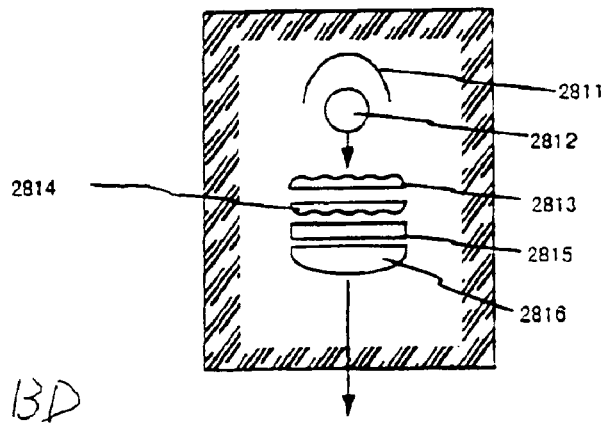

FIG. 13D shows an example of a structure of the light source optical system 2801 shown in FIG. 13C. In this example, the light source optical system 2801 comprises a reflector 2811, light sources 2812, 2813 and 2814, a polarizing conversion element 2815 and a convergent lens 2816. The light source optical system shown in FIG. 13D is a mere example, but it is not limited thereto. For example, an optical system, such as an optical lens, a film having a polarizing function, a film for adjusting phase difference and an IR film, may be provided in the light source optical system by the practician.

As described in the foregoing, the field of application of the invention is extremely broad, and the invention can be applied to any electronic device of all the fields. Furthermore, an electronic device of this example can be realized by any combination obtained from Examples 1 to 7.

Because a semiconductor device according to the invention has an excellent active layer, particularly excellent interface characteristics between the channel forming region and the first gate insulating film, a semiconductor device having excellent electric characteristics can be obtained.

Only a heat treatment at about 450° C. can be applied to a conventional single layer gate wiring of aluminum due to a low heat resistance of the aluminum material. Furthermore, in the conventional constitution, it is highly likely that aluminum atoms diffuse into the gate insulating film and the active layer even by the heat treatment at about 450° C., so as to cause unevenness and lowering of the electric characteristics of the TFT.

However, because the invention has the structure in that the second wiring layer of the gate wiring is protected by the anodic oxide of a barrier type and the first wiring layer, deformation of the second wiring layer and diffusion of aluminum atoms can be prevented, and thus the upper limit of the. heating temperature after the formation of the gate wiring can be set at about from 500 to 650° C.

Accordingly, after the formation of the gate wiring, a heat treatment for activation of an impurity in the source region and the drain region, a heat treatment for recovering the crystalline structure of the active layer that has been damaged by the doping step, and a heat treatment for lowering the catalytic element concentration in the channel forming region by utilizing the source region and the drain region, to which phosphorous is added, as a gettering sink can be conducted.

Furthermore, because diffusion of a metallic element from the second wiring layer is blocked by the first wiring layer, the impurity concentration of the active layer, particularly the interface between the channel forming region and the first gate insulating film, can be the substantially same as the semiconductor film having an amorphous substance in the state immediately after the film formation.

What is claimed is:

1. A method for manufacturing a semiconductor device comprising steps of:

providing nickel to at least a part of a semiconductor film formed over a substrate;

subjecting said semiconductor film to oxygen plasma; and crystallizing said semiconductor film after subjecting said semiconductor film to the oxygen plasma to obtain a crystalline semiconductor film.

2. A method according to claim 1, wherein said crystallizing is performed by crystallizing said semiconductor film by irradiating with one of an infrared ray and a laser light.

3. A method according to claim 1, wherein said semiconductor film is crystallized through one of a solid state and an intermediate state between the solid state and a liquid state.

4. A method according to claim 1, wherein said gate insulating film is continuously formed without exposing to the air after forming said semiconductor film.

5. A method for manufacturing a semiconductor device comprising steps of:
   providing nickel to at least a part of a semiconductor film formed over a substrate;
   subjecting said semiconductor film to plasma comprising oxygen and helium; and
   irradiating said semiconductor film after subjecting said semiconductor film to the plasma with one of an infrared ray and a laser light.

6. A method according to claim 5, wherein said semiconductor film is crystallized through one of a solid state and an intermediate state between the solid state and a liquid state.

7. A method for manufacturing a semiconductor device comprising steps of:
   providing nickel to at least a part of a semiconductor film formed over a substrate;
   subjecting said semiconductor film to oxygen plasma;
   crystallizing said semiconductor film after subjecting said semiconductor film to the oxygen plasma using said material, to obtain a crystalline semiconductor film;
   patterning said crystalline semiconductor film and said gate insulating film;
   forming a second gate insulating film so as to cover said crystalline semiconductor film and said gate insulating film after patterning them.

8. A method according to claim 7, wherein said crystallizing is performed by crystallizing said semiconductor film by irradiating with one of an infrared ray and a laser light.

9. A method according to claim 7, wherein said semiconductor film is crystallized through one of a solid state and an intermediate state between the solid state and a liquid state.

10. A method for manufacturing a semiconductor device comprising steps of:
    providing nickel to at least a part of a semiconductor film formed over a substrate;
    subjecting said semiconductor film to oxygen plasma;
    irradiating said semiconductor film after subjecting said semiconductor film to the oxygen plasma with one of an infrared ray and a laser light; and
    patterning said crystalline semiconductor film.

11. A method according to claim 10, further comprising a step of forming a second gate insulating film on the patterned semiconductor film.

12. A method according to claim 10, wherein said semiconductor film is crystallized through one of a solid state and an intermediate state between the solid state and a liquid state.

13. A method for manufacturing a semiconductor device comprising steps of:
    providing nickel to at least a part of a semiconductor film formed over a substrate;
    subjecting said semiconductor film to oxygen plasma;
    crystallizing said semiconductor film after subjecting said semiconductor film to the oxygen plasma to obtain a crystalline semiconductor film; and
    patterning said crystalline semiconductor film.

14. A method according to claim 13, wherein said crystallizing is performed by crystallizing said semiconductor film by irradiating with one of an infrared ray and a laser light.

15. A method according to claim 13, wherein said semiconductor film is crystallized through one of a solid state and an intermediate state between the solid state and a liquid state.

16. A method for manufacturing a semiconductor device comprising steps of:
    providing nickel to at least a part of a semiconductor film formed over a substrate;
    subjecting said semiconductor film to oxygen plasma; and
    irradiating said semiconductor film after subjecting said semiconductor film to the oxygen plasma with one of an infrared ray and a laser light.

17. A method according to claim 16, wherein said semiconductor film is crystallized through one of a solid state and an intermediate state between the solid state and a liquid state.

* * * * *